United States Patent
Hayashi et al.

(10) Patent No.: US 6,790,283 B2
(45) Date of Patent: Sep. 14, 2004

(54) COATING APPARATUS

(75) Inventors: Shinichi Hayashi, Koshi-Machi (JP);
Hirofumi Ookuma, Koshi-Machi (JP);
Kouichi Suefuji, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 80 days.

(21) Appl. No.: 10/271,795

(22) Filed: Oct. 17, 2002

(65) Prior Publication Data

US 2003/0113440 A1 Jun. 19, 2003

(30) Foreign Application Priority Data

Oct. 18, 2001 (JP) ........................................ 2001-321007

(51) Int. Cl.$^7$ ............................................. B05C 11/00
(52) U.S. Cl. ........................ 118/665; 118/693; 118/697; 118/712
(58) Field of Search ................................ 118/665, 693, 118/697, 712

(56) References Cited

U.S. PATENT DOCUMENTS 5,374,312 A * 12/1994 Hasebe et al.
6,238,107 B1 * 5/2001 Inada

* cited by examiner

Primary Examiner—Bernard Pianalto
(74) Attorney, Agent, or Firm—Oblon, Spivak, McClelland, Maier & Neustadt, P.C.

(57) ABSTRACT

A processing solution is supplied from processing-solution suppliers onto the surfaces of targets to be processed while a flow rate of the processing solution is being adjusted. The processing solution is fed from a processing-solution supply source at a specific pressure via a processing-solution pressure-up feeder. The pressure of the processing solution fed via the processing-solution pressure-up feeder is adjust to another specific pressure or more at least when the processing-solution suppliers are operating simultaneously. A flow-rate detector detects the flow rate of the processing solution supplied from each processing-solution supplier. A pressure detector detects the pressure of the processing solution fed via the processing-solution pressure-up feeder. The flow-rate adjuster and the pressure adjuster are controlled based on prestored control data and detection signals from the flow-rate detector and the pressure detector so that the same amount of processing solution is supplied to the targets from the processing-solution suppliers.

5 Claims, 16 Drawing Sheets

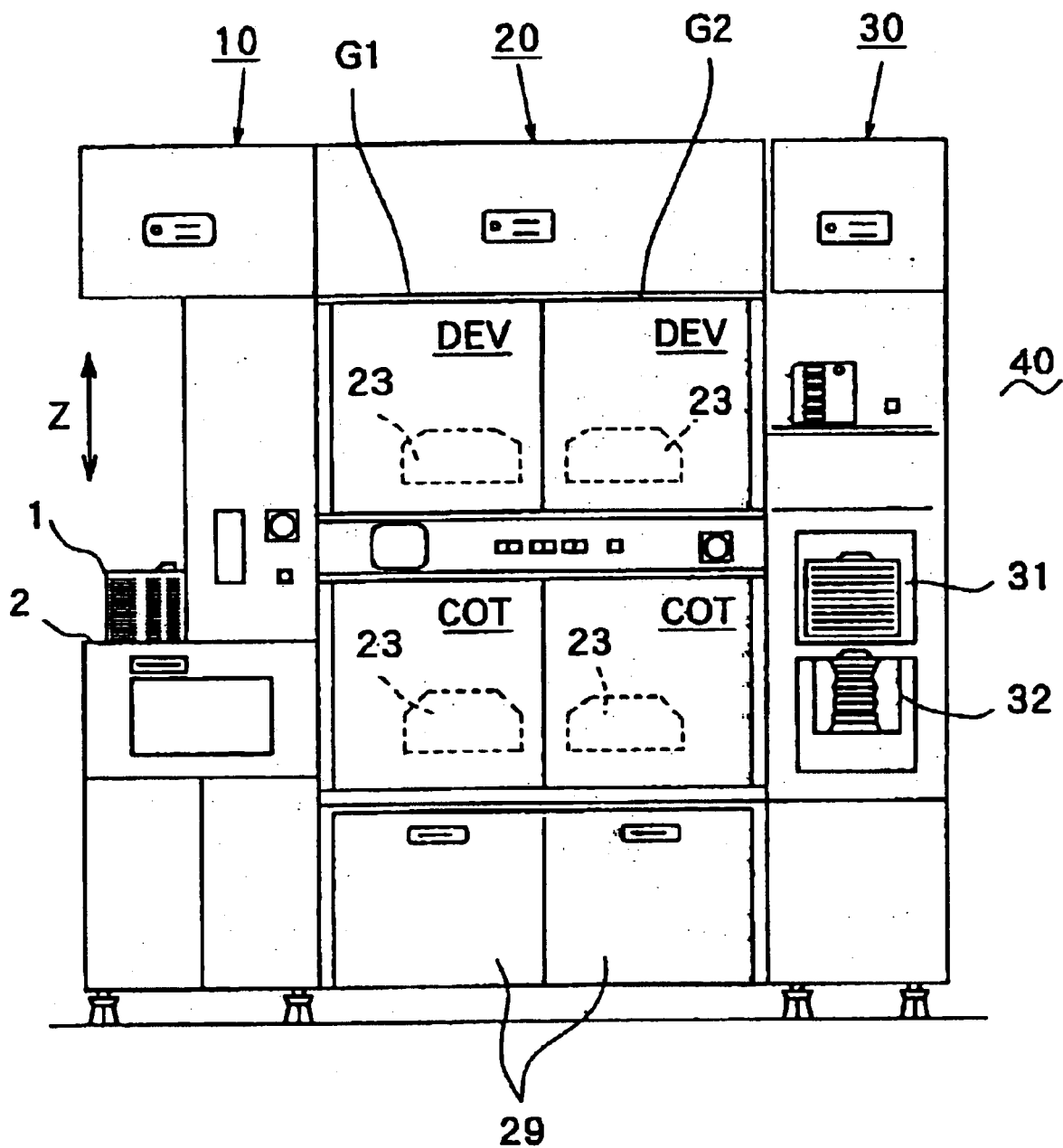
F I G. 3

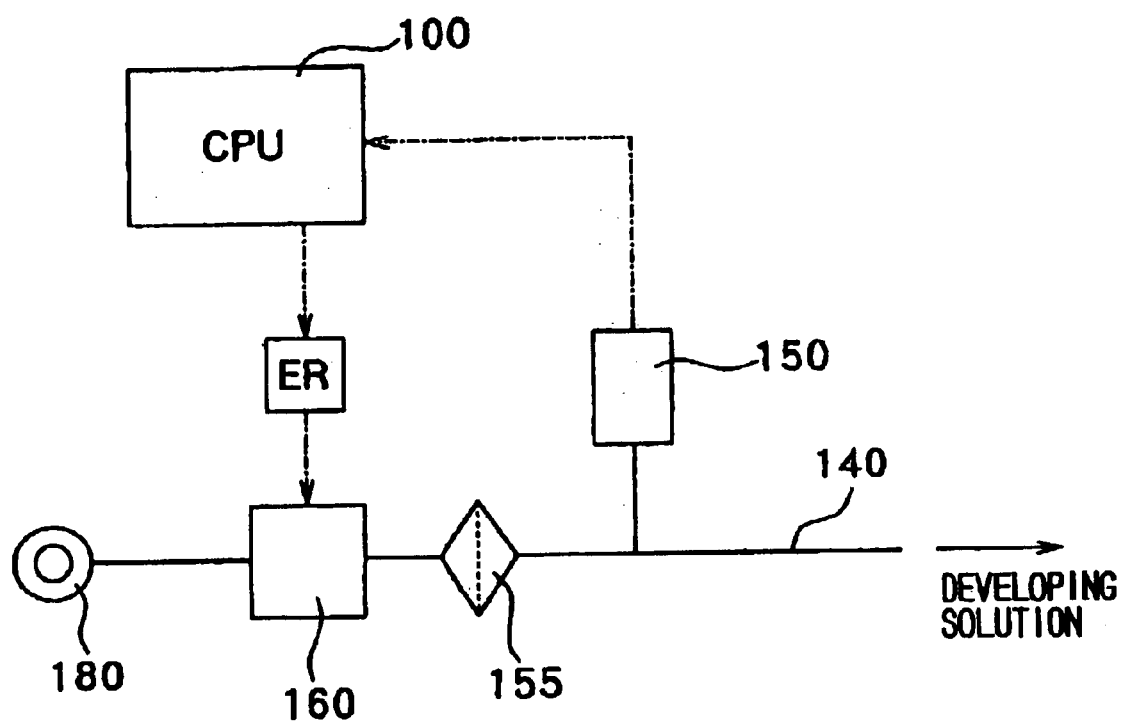
F I G. 9

(a)

(b)

(c)

COATED AREA

COATING APPARATUS

BACKGROUND OF THE INVENTION

The present invention relates to a method and an apparatus for coating the surface of a target to be processed, such as, a semiconductor wafer and a LCD substrate with a coating solution, such as, a resist solution and a developing solution.

A semiconductor-device manufacturing procedure usually involves a developing process in which a resist solution, for example, is applied on a semiconductor wafer or a LCD substrate (called a wafer hereinafter) to form a resist film thereon which is then exposed to light through a circuit pattern reduced by photolithography, followed by applying a developing solution on the wafer.

A known coating apparatus such as shown in FIG. 1 is used for applying a developing solution (or a resist solution) on a wafer. The coating apparatus is equipped with a supply nozzle 110 for supplying a developing solution (or a resist solution) on a wafer, a feed pump 160 for feeding a developing solution contained in a developing-solution tank 180 to the supply nozzle 110, a regulator R for regulating the pressure at which the developing solution is supplied from the feed pump 160, a valve V0 through which the developing solution is supplied or seized, a flow meter 125 for measuring the flow rate of the developing solution and a CPU 100 for watching open/close of the valve V0 and the amount of the developing solution while supplied.

The known coating apparatus requires manual operations in which an operator uses a needle to adjust an opening degree of the valve V0, thus opening-degree readjustments being impossible during a coating process. Not only that, the known apparatus requires regulation of the feed pump 160 so that it can feed a developing solution at a constant pressure.

Such inconveniences further cause necessity of several feed pumps each for one of several supply nozzles when the known apparatus is equipped with several nozzles, which resulting in large size and high cost for the known apparatus.

The known apparatus is also disadvantageous in that the lift from the feed pump 160 to the supply nozzle 110 causes insufficiency of the amount of developing solution.

In addition, the imbalance between the pressure for the feed pump 160 for feeding a developing solution and the opening degree of the valve V0 could cause variation in width of developing solution on a wafer when the developing solution hits the wafer at high pressure at a discharging-starting moment of developing solution.

SUMMARY OF THE INVENTION

A purpose of the present invention is to provide a coating method and a coating apparatus with automatic coating-solution flow-rate adjustments during a coating process and high controllability of flow-rate and pressure adjusters in accordance with how a coating-solution supplier is (or coating-solution suppliers are) used, thus achieving compactness in apparatus, uniformity of coating process and economical use of coating solution.

The present invention provides a method of a coating method including the steps of: supplying a processing solution onto surfaces of targets to be processed from a plurality of processing-solution suppliers; adjusting, via a flow-rate adjuster, a flow rate of the processing solution while supplied to each target from the corresponding processing-solution supplier; feeding the processing solution from a processing-solution supply source at a specific pressure via a processing-solution pressure-up feeder; adjusting, via a pressure adjuster, the pressure of the processing solution fed via the processing-solution pressure-up feeder to another specific pressure or more at which the processing solution is fed to the processing-solution suppliers at least when the processing-solution suppliers are operating simultaneously; detecting, via a flow-rate detector, a flow rate of the processing solution supplied via the processing-solution pressure-up feeder; detecting, via a pressure detector, the pressure of the processing solution fed via the processing-solution pressure-up feeder; and controlling the flow-rate adjuster and the pressure adjuster based on prestored control data and detection signals from the flow-rate detector and the pressure detector so that same amount of the processing solution is supplied to the targets to be processed from the processing-solution suppliers.

Moreover, the present invention provides a coating method including the steps of: supplying a processing solution onto a surface of at least one target to be processed from at least one processing-solution supplier, the surface of the target being divided into a plurality of fields; adjusting, via a flow-rate adjuster, a flow rate of the processing solution while supplied to each field on the target while the processing-solution supplier is moving in relative motion to the target; feeding the processing solution from a processing-solution supply source at a specific pressure via a processing-solution pressure-up feeder; adjusting, via a pressure adjuster, the pressure of the processing solution fed via the processing-solution pressure-up feeder to another specific pressure or more at which the processing solution is supplied to all of the fields on the target at least simultaneously; detecting, via a flow-rate detector, a flow rate of the processing solution supplied to each field on the wafer; detecting, via a pressure detector, the pressure of the processing solution fed via the processing-solution pressure-up feeder; and controlling the flow-rate adjuster and the pressure adjuster based on prestored control data and detection signals from the flow-rate detector and the pressure detector so that the processing solution is supplied to each field on the target at a predetermined flow rate from the processing-solution suppliers.

Furthermore, the present invention provides a coating apparatus including: a plurality of processing-solution suppliers to supply a processing solution onto surfaces of a plurality of targets to be processed; a flow-rate adjuster, provided for each processing-solution supplier, to adjust a flow rate of the processing solution while supplied to the targets; a processing-solution pressure-up feeder to feed the processing solution from a processing-solution supply source at a specific pressure to each processing-solution supplier; a pressure adjuster to adjust the pressure of the processing solution fed via the processing-solution pressure-up feeder to another specific pressure or more at which the processing solution is fed to the processing-solution suppliers at least when the processing-solution suppliers are operating simultaneously; a flow-rate detector to detect a flow rate of the processing solution supplied from each processing-solution supplier; a pressure detector to detect the pressure of the processing solution fed via the processing-solution pressure-up feeder; and a controller to control the flow-rate adjuster and the pressure adjuster based on prestored control data and detection signals from the flow-rate detector and the pressure detector so that the same amount of processing solution is supplied to the targets from the processing-solution suppliers.

Moreover, the present invention provides a coating apparatus including: at least one processing-solution supplier having a plurality of processing-solution supplying apertures divided into a plurality of blocks through which a processing solution is supplied onto a surface of at least one target to be processed; a transfer mechanism to move the processing-solution supplier in relative motion to the target; a flow-rate adjuster, provided for each block of the processing-solution supplier, to adjust a flow rate of the processing solution while supplied to the target; a processing-solution pressure-up feeder to feed the processing solution from a processing-solution supply source at a specific pressure to the processing-solution supplier; a pressure adjuster to adjust the pressure of the processing solution fed via the processing-solution pressure-up feeder to another specific pressure or more at which the processing solution is fed at least to one or more of the blocks through which the processing solution is supplied simultaneously; a flow-rate detector to detect a flow rate of the processing solution supplied through each block of the processing-solution supplier; a pressure detector to detect the pressure of the processing solution fed via the processing-solution pressure-up feeder; and a controller to control the flow-rate adjuster and the pressure adjuster based on prestored control data and detection signals from the flow-rate detector and the pressure detector so that a predetermined flow rate of processing solution is supplied to the target through each block of the processing-solution supplier.

Still, furthermore, the present invention provides a processing-solution supplying method including the steps of: increasing a flow rate of a processing solution up to a set constant rate toward a region in the vicinity of an edge of a rotating target to be processed; supplying the processing solution at the set constant rate from the region in the vicinity of the edge to another region in the vicinity of the center of the target; decreasing the flow rate of the processing solution on a specific region between the region in the vicinity of the center of the target to a region in the vicinity of another edge of the target, thus spreading the processing solution over the surface of the target; and decreasing further gradually the flow rate of the processing solution from the specific region to the region in the vicinity of the other edge of the target.

BRIEF DESCRIPTION OF DRAWINGS

FIG. 3 is a schematic front view of the resist-solution coating/developing system shown in FIG. 2;

FIG. 9 is a schematic illustration of other components of the coating apparatus according to the present invention;

DETAILED DESCRIPTION OF PREFERRED EMBODIMENTS

Preferred embodiments according to the present invention will be disclosed with reference to the attached drawings.

The embodiments to be disclosed below employ several developing (DEV) units for developing semiconductor wafers, for the coating apparatus according to the present invention.

Figure 1:
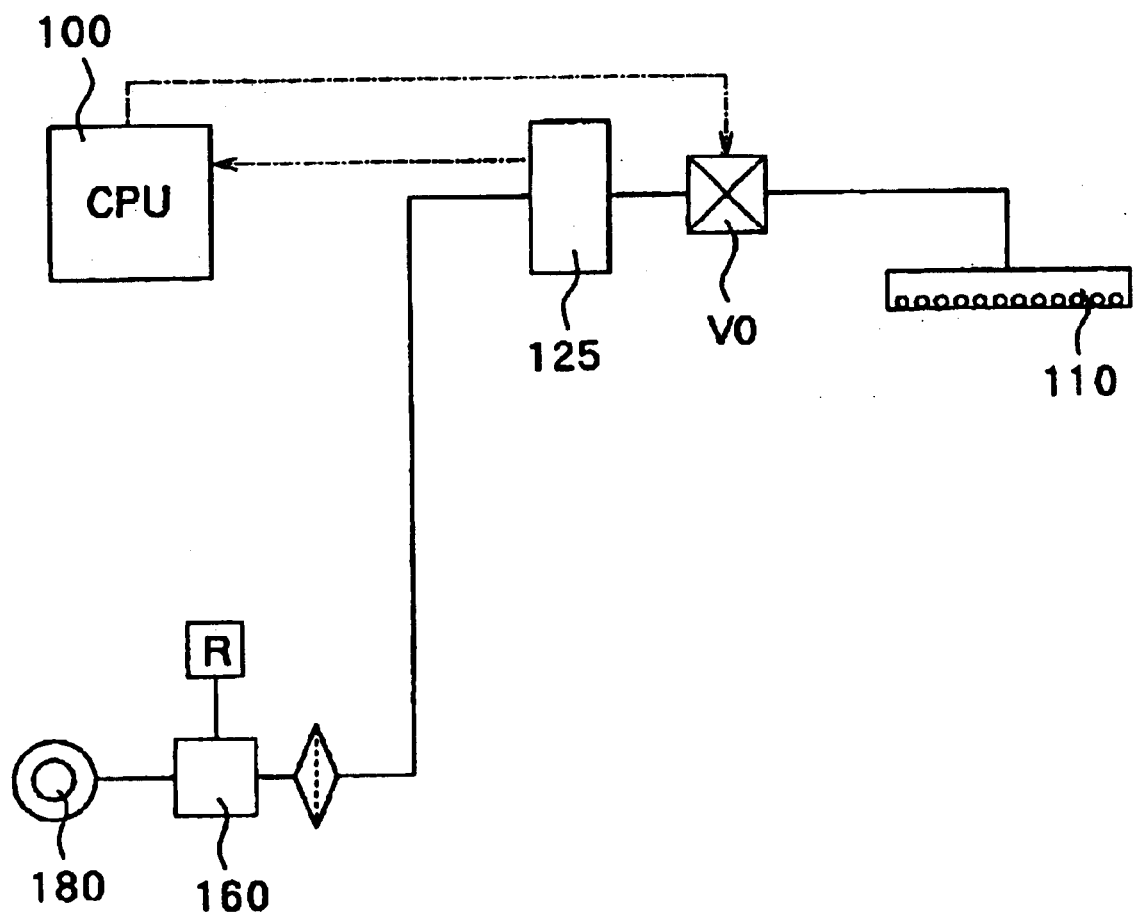
FIG. 1 is a schematic illustration of a known coating apparatus.
Figure 2:
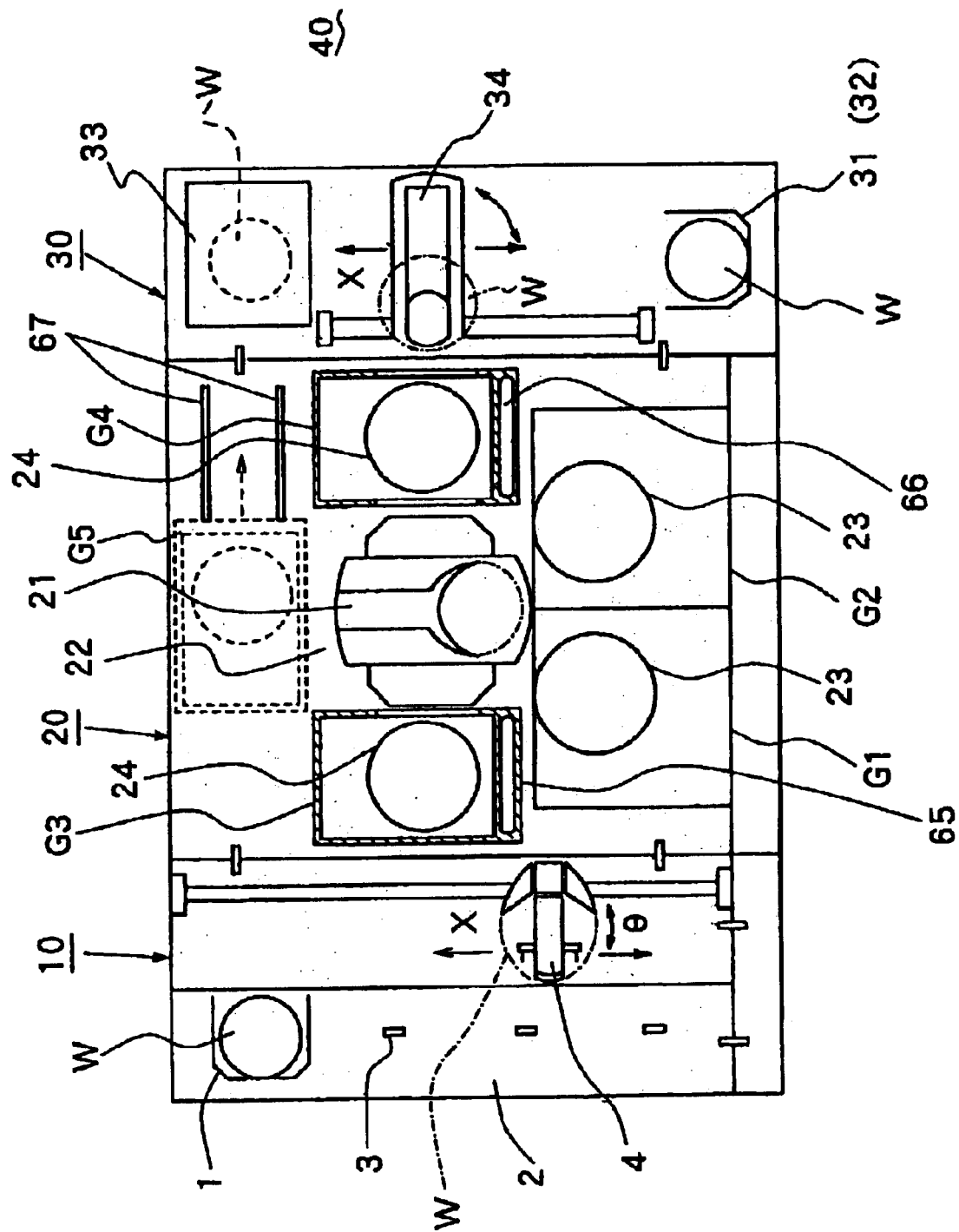
FIG. 2 is a schematic plan view of a resist-solution coating/developing system to which a coating apparatus according to the present invention is applied.

A resist-solution coating/developing system shown in FIG. 2, an embodiment of the present invention, includes a cassette station 10, a processing station 20 and an interface station 30, constituting the major section of the system.

Several semiconductor wafers (called just wafers hereinafter) W to be processed, for example, 25 wafers contained in a wafer cassette 1 are transferred, via the cassette station 10, to or from the resist-solution coating and developing system.

Provided in the processing station 20 are DEV units and other types of processing units for processing wafers W one by one in a coating/developing process, stacked each other in multi-stages at respective positions.

Each wafer W is transferred, via the interface station 30, from/to the processing station 20 to/from an exposing unit (not shown) provided next to the station 20.

As shown in FIG. 2, formed on the cassette station 10 are, for example, four protrusions 3 on a cassette table 2, on which four wafer cassettes 1 are aligned in a direction X horizontal to the processing station 20. Also provided on the cassette station 10 are a pair of wafer-transferring tweezers 4 for transferring wafers W to/from any wafer cassette 1, movable in the cassette-aligned direction (direction X) and also a wafer-arranged direction (direction Z) in which the wafers W are contained vertically in each wafer cassettes 1. The wafer-transferring tweezers 4 are also rotatable in a direction θ for transferring the wafers W to an alignment (ALIM) unit and an extension (EXT) unit belonging to the third multi-stage unit group G3 in the processing station 20, which will be disclosed later.

The processing station 20 is equipped, at its center, with a vertical-transfer type main wafer-transfer mechanism 21 in a chamber 22. All single- or multi-stage processing units are provided to surround the chamber 22. Shown in FIG. 2 are five groups of multi-stage processing units G1, G2, G3, G4 and G5. The first and second multi-stage processing-unit groups G1 and G2 are arranged in parallel at the system front side (the lower side in FIG. 2). The third multi-stage processing unit group G3 is placed next to the cassette station 10. The fourth multi-stage processing unit group G4 is placed next to the interface station 30. The fifth multi-stage processing unit group G5 is placed at the system rear side.

Figure 5:
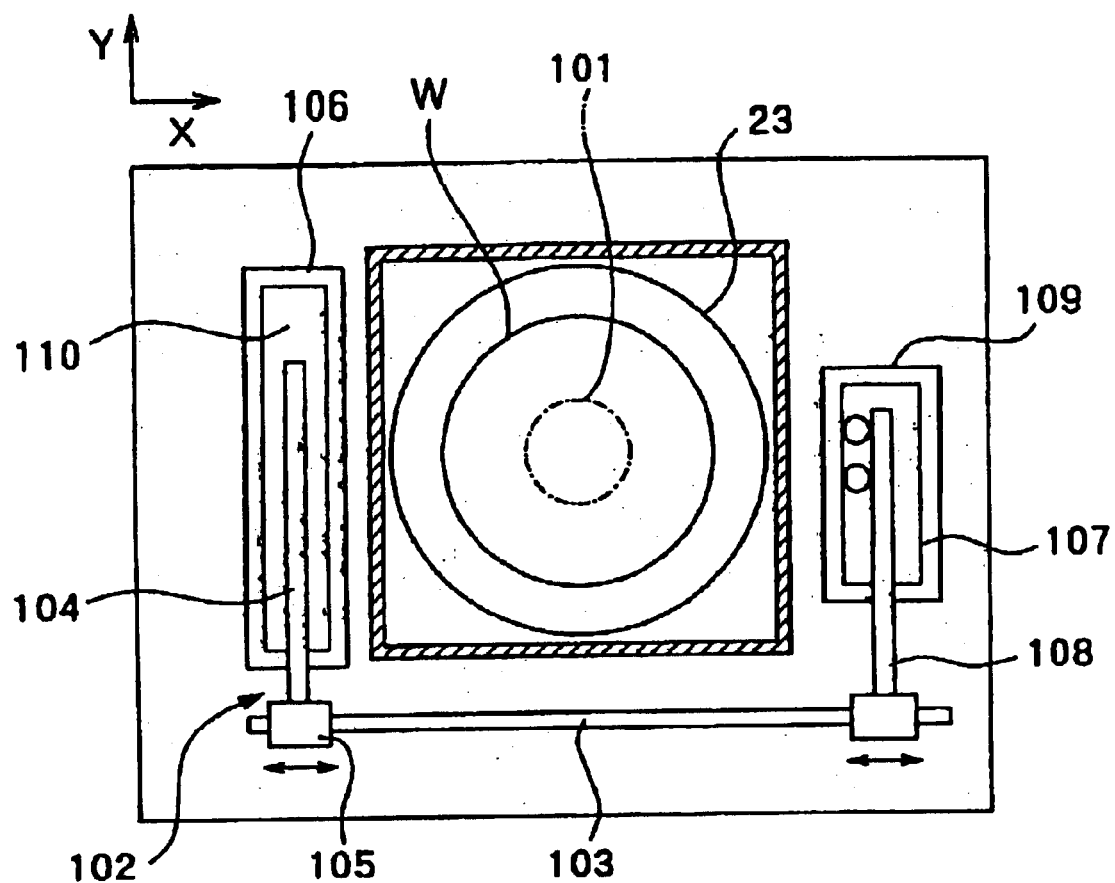
FIG. 5 is a schematic plan view of a processing-solution supplier according to the present invention.

In detail, as shown in FIG. 3, the first processing-unit group G1 consists of two spinner-type processing units, such as, a resist-coating (COT) unit and a developing (DEV) unit for developing resist patterns stacked in order, for processing each wafer W placed on a spin chuck 101 in a cup 23 (FIG. 5). The second processing-unit group G2 also consists of two spinner-type processing unit, such as, a COT unit and a DEV unit stacked in order. The COT units are arranged at the lower stage for easy resist-solution disposal with simple mechanism and easy maintenance. The COT units may of course be arranged at the upper stage. Or, several COT units may be stacked in each of the first and second processing-unit groups G1 and G2.

Figure 4:
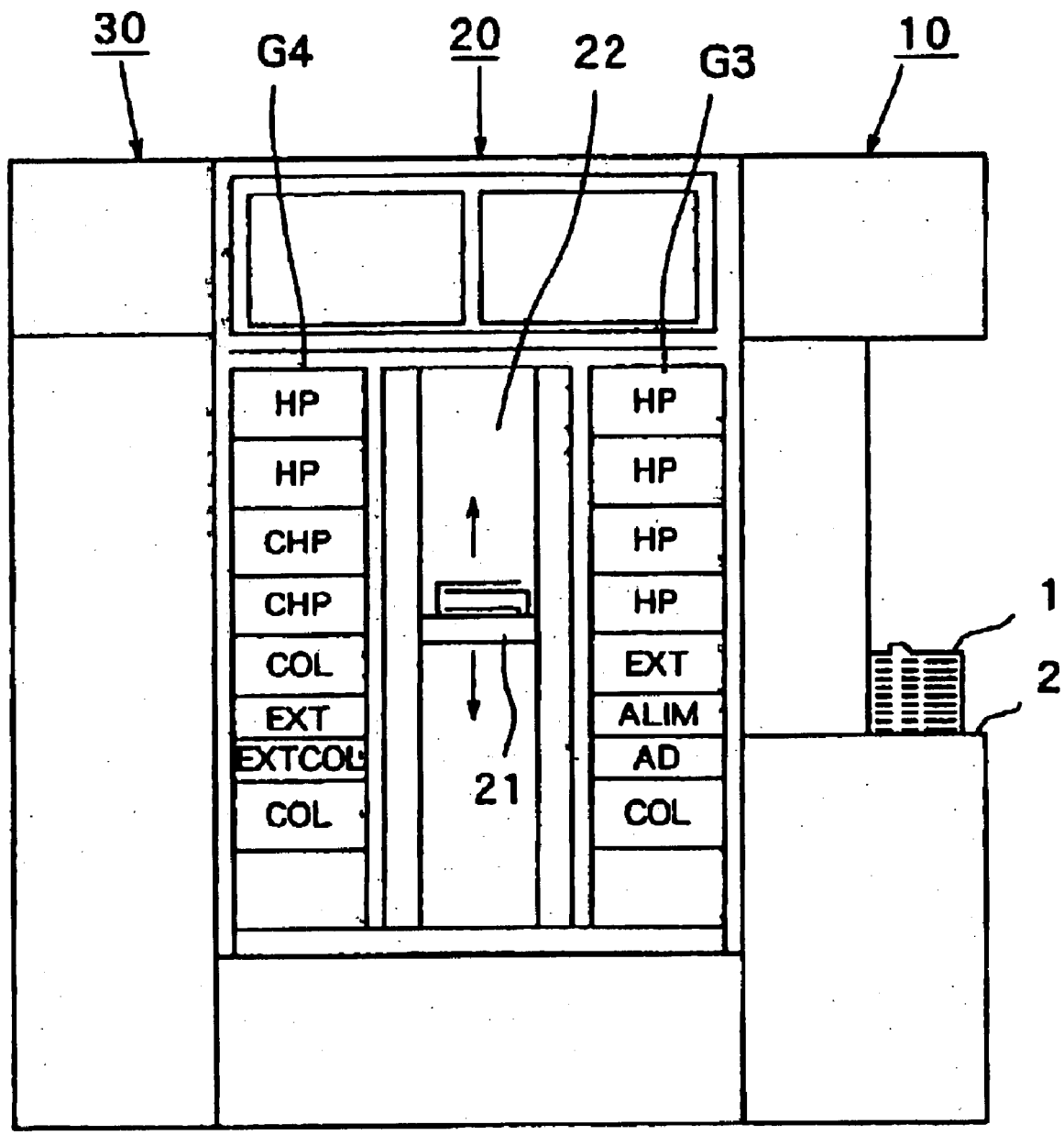
FIG. 4 is a schematic rear view of the resist-solution coating/developing system shown in FIG. 2.

The first processing-unit group G1 consists of, as shown in FIG. 4, eight oven-type processing units for processing each wafer W placed on a wafer table 24 (FIG. 2) such as a cooling (COL) unit for cooing wafers W, an adhesion (AD) unit for wafer hydrophobic processing to wafers W, an alignment (ALIM) unit for aligning wafers W, an extension (EXT) unit for wafer transfer and four hot plate (HP) units for baking wafers W, stacked in order. The second processing-unit group G2 also consists of eight oven-type processing units such as a COL unit, an extension cooling (EXTCOL) unit, an EXT unit, another COL unit, two chilling hot plates (CHP) for wafer quick chilling and two hot plates (HP) units, stacked in order. The COL and EXTCOL units for relatively low-temperature processing are arranged at the lower stages whereas the HP, CHP and AD units for relatively high-temperature processing are arranged at the upper stages, for less thermal interference among the units. These units may, of course, be stacked randomly.

Two ducts 65 and 66 are provided perpendicularly to the direction X, as shown in FIG. 2, along the side walls of the oven-type third and fourth multi-stage processing-unit groups G3 and G4 in the vicinity of the spinner-type first and second multi-stage processing-unit groups G1 and G2. Clean air or air adjusted at a particular temperature will be down flown into the resist-solution coating/developing system through the ducts 65 and 66. Moreover, heat generated in the third and fourth unit groups G3 and G4 will be shut out by the ducts for no thermal affection to the first and second unit groups G1 and G2.

The resist-solution coating/developing system may further be equipped with the fifth multi-stage processing-unit group G5 as indicated by a dot line at the back of the main wafer-transfer mechanism, as shown in FIG. 2. The fifth unit group G5 is slidable along a guide rail 67 in a direction indicated by an arrow, in creating a space for user-friendly maintenance from the back of the main wafer-transfer mechanism 21.

The interface station 30 has the same depth as the processing station 20 but narrower than the latter in width.

Provided in the interface station 30 are two-stage detachable pick-up cassette 31 and a fixed buffer cassette 32 at the front, a peripheral exposing unit 33 at the rear and a wafer-transfer arm 34 in the middle. The arm 34 is movable in the directions X and Z for wafer transfer to the cassettes 31 and 32, and the exposing unit 33. It is also rotatable in the direction θ for wafer transfer to the EXT unit in the fourth multi-stage processing-unit group G4 on the processing station 20.

The resist-solution coating/developing system is installed in a clean room 40 (FIG. 2) at a high cleanliness with an efficient vertical laminar-flow system.

The resist-solution coating/developing system will further be disclosed in detail for its operation.

The pair of wafer-transferring tweezers 4 access a cassette 1, set on the cassette table 2, containing unprocessed wafers W and pick up one wafer W on the cassette station 10. The tweezers 4 move to the ALIM unit in the third multi-stage processing-unit group G3 on the processing station 20 and place the wafer W on the wafer table 24 for wafer orientation-flat positioning and centering.

The main wafer-transfer mechanism 21 then accesses the ALIM unit from the other side to receive the wafer W and transfers it first to the AD unit in third unit group G3 for wafer hydrophobic processing.

On completion of hydrophobic processing, the main wafer-transfer mechanism 21 takes out the wafer W from the AD unit and transfers it to a COL unit in the third or the fourth unit group G3 or G4 for cooling the wafer W to a set temperature such as 23° C.

The transfer mechanism 21 takes out the wafer W from the COL unit on completion of cooling and transfers it to a COT unit in the first or the second unit group G1 or G2 for applying resist over the wafer W at a uniform film thickness by spin coating.

On completion of coating, the main wafer-transfer mechanism 21 takes out the wafer W from the COT unit and transfers it to an HP unit in the third or the fourth unit group G3 or G4 for prebaking for a predetermined period at a set temperature such as 100° C., to evaporate solvent remaining on the coating film over the wafer W.

The main wafer-transfer mechanism 21 takes out the wafer W from the HP unit on completion of prebaking and transfers it to the EXTCOL unit in the fourth unit group G4 for cooling the wafer W to a set temperature such as 24° C. suitable for the next peripheral exposure in the peripheral exposing unit 33.

After this cooling, the main wafer-transfer mechanism 21 takes out the wafer W from the EXTCOL unit and transfers it to the EXT unit just above the EXTCOL unit. When the wafer W is set on a table (not shown) in the EXTCOL unit, the wafer-transfer arm 34 in the interface station 30 accesses the EXTCOL-unit table from the other side, receives the wafer W and transfer it to the peripheral exposing unit 33 for peripheral exposure on the wafer edges.

On completion of peripheral exposure, the wafer-transfer arm 34 transfers the wafer W from the peripheral exposing unit 33 to a wafer table (not shown) at an adjacent exposing unit side. The wafer W may, however, be stored once in the buffer cassette 32 before transferred to the adjacent exposing unit.

When the wafer W is returned to the wafer table at the exposing unit side on completion of exposure over the entire wafer surface, the wafer-transfer arm 34 accesses the wafer table to receive the wafer W and transfers it to the EXT unit in the forth unit group G4 on the processing station 20. The wafer W may also be stored once in the buffer cassette 32 before transferred to the processing station 20.

The wafer W set on a wafer table in the EXT unit is transferred by the main wafer-transfer mechanism 21 to the CHP unit 34 for post-exposure baking to prevent fringe formation or induce acid catalysis with a chemical-amplified resist (CAR).

The wafer W is then transferred to the DEV unit in the first or the second unit group G1 or G2. A developing solution is supplied over the resist on the wafer W set on the spin chuck 101 in the DEV unit. On completion of development, a cleaning solution is pored over the wafer W to wash away the developing solution.

On completion of development, the main wafer-transfer mechanism 21 transfers the wafer W from the DEV unit to an HP unit in the third or the fourth unit group G3 or G4 for postbaking for a predetermined period at a set temperature such as 100° C. to harden the resist swelled due to development for enhanced chemical resistance.

The main wafer-transfer mechanism 21 takes out the wafer W from the HP unit on completion of postbaking and transfers it to a COL unit in the third or the fourth unit group G3 or G4.

Once the wafer W has been cooled to an ambient temperature, it is transferred by the main wafer-transfer mechanism 21 to the EXT unit in the third unit group G3. The wafer-transferring tweezers 4 accesses the EXT unit from the other side to receive the wafer W set on a wafer table (not shown) in the EXT unit.

The wafer-transferring tweezers 4 transfer the wafer W to a cassette 1 for containing already-processed wafers and insert it into a wafer-receiving slot in the cassette 1, thus finishing the procedure.

As shown in FIG. 5, the DEV unit is mainly equipped with the spin chuck 101 that will rotate horizontally while holding a wafer W by vacuum suction, the cup 23 to enclose the spin chuck 101, provided with an exhaust opening and a drain opening at the bottom, a developing-solution supply nozzle (called a supply nozzle hereinafter) 110 (as a developing-solution supplier) provided above the spin chuck 101 and a supply-nozzle scanning arm 102 for moving the supply nozzle 110 over a wafer W in relative motion.

Figure 6:
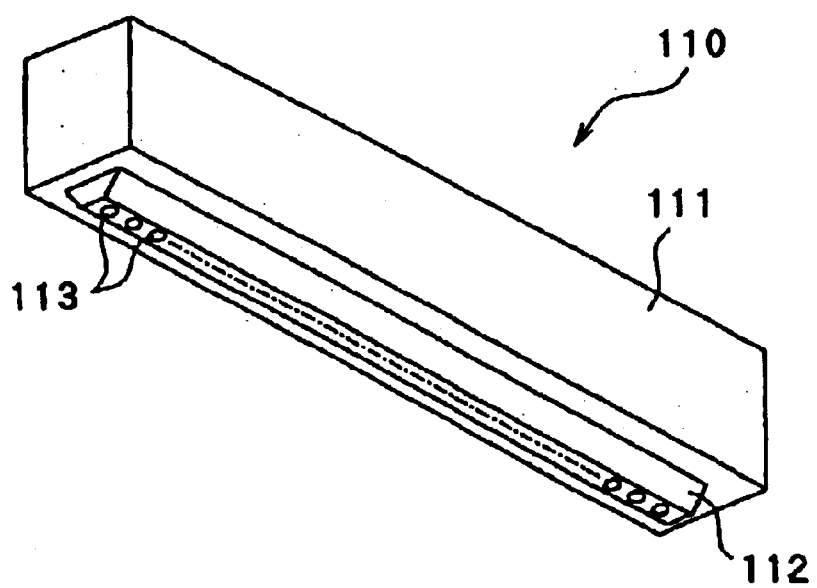
FIG. 6 is a schematic perspective view of the processing-solution supplier according to the present invention.

The supply nozzle 110 is equipped, as shown in FIG. 6, with a long rectangular nozzle body 111 into which a developing solution is supplied and a nozzle section 112 provided on the bottom of the nozzle body. The nozzle section 112 has many developing-solution discharging apertures 113 aligned to create a developing-solution discharging area having a length corresponding to or longer than the effective-area (device-forming area) width on a wafer W.

As shown in FIG. 5, the supply nozzle 110 is movable by the supply-nozzle scanning arm 102 along a guide rail 103 provided as extending in a direction X outside the cup 23. In detail, the supply nozzle 110 is movable in such a way that it crosses over the wafer W from a waiting section 106 (corresponding to one end of the rail 103) to a predetermined position toward the other end of the rail.

The supply-nozzle scanning arm mechanism 102 is equipped with an arm 104 from which the supply nozzle 110 is suspended so that the developing-solution discharging apertures 113 are aligned in a direction Y and a base 105 movable in the direction X, for example, by a motor or an air cylinder (both not shown). The arm mechanism 102 is then movable along the guide rail 103 on the movable base 105 that has an elevator such as a ball-screw mechanism (not shown) driven by a motor (not shown), etc. to lift the arm 104.

Also provided as movable in the direction X along the guide rail 103 is a cleaning-nozzle scanning arm mechanism 108 for supporting a cleaning nozzle 107, in addition to the supply-nozzle scanning arm mechanism 102 for supporting the supply nozzle 110.

The cleaning nozzle 107 is movable such that it crosses over the wafer W in a linear motion between a cleaning-nozzle waiting section 109 and a cleaning-solution discharging position set above the wafer periphery in a linear motion.

Figure 7:
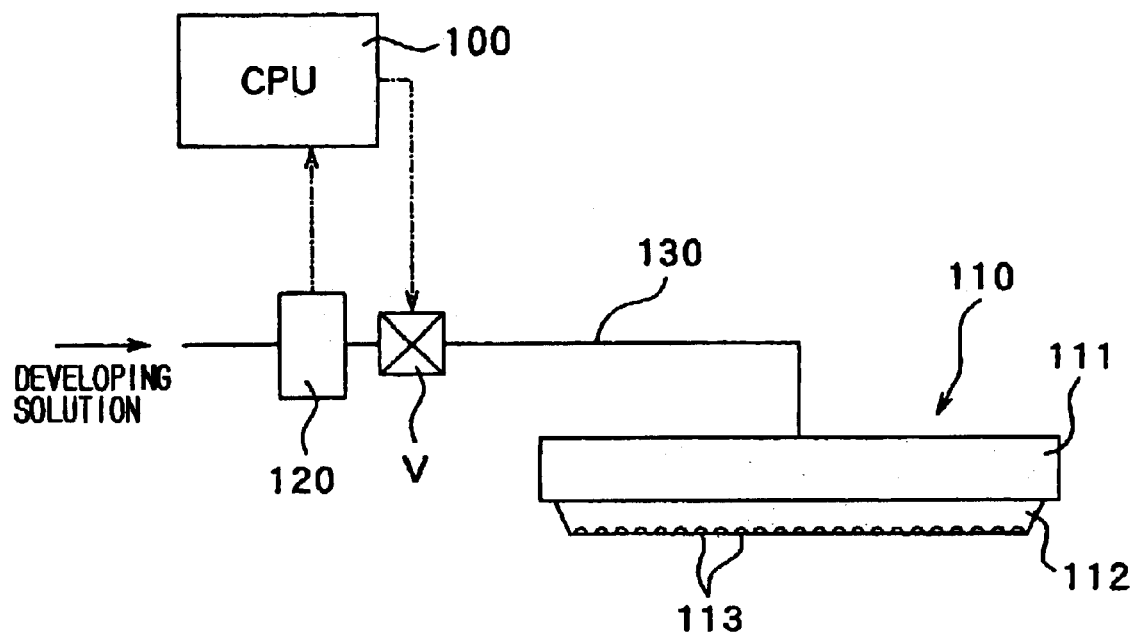
FIG. 7 is a schematic illustration of the major components of a coating apparatus according to the present invention.

The supply nozzle 110 is connected, as shown in FIG. 7, to a branch pipe 130 provided with a flow-rate adjuster, such as an electronically-controlled valve mechanism V, for adjusting a flow rate of a developing solution supplied over the wafer surface and a flow-rate detector, such as an ultrasonic flowmeter 120, for detecting the flow rate of developing solution supplied from the supply nozzle 110.

Figure 8:
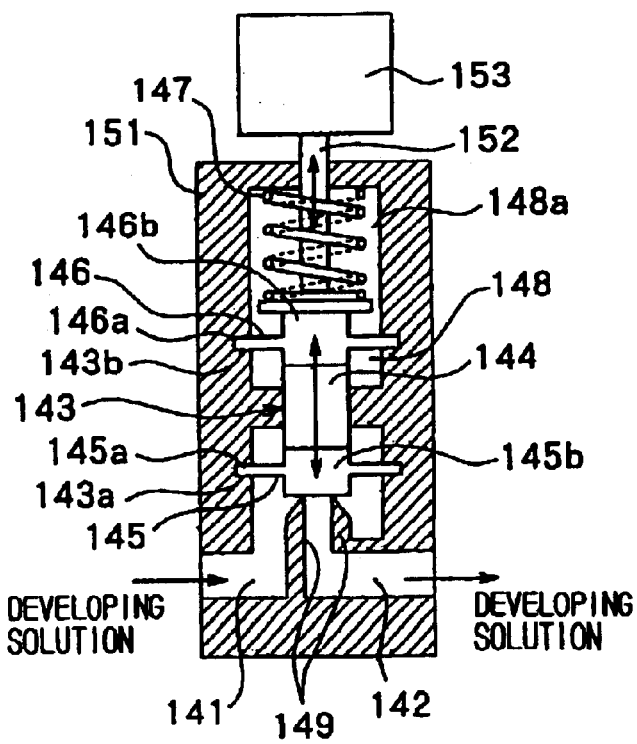
FIG. 8 is a schematic sectional view of a flow-rate adjuster of the coating apparatus according to the present invention.

The electronically-controlled valve mechanism V (called just a valve V hereinafter) is equipped, as shown in FIG. 8, with a valve 145b and a gate 149 provided between an inflow passage 141 and an outflow passage 142 formed in a valve casing 152. The gate 149 will be opened by the valve 145b driven by a motor 153.

In detail, the inflow and outflow passages 141 and 142 are arranged so that the tube-like gate 149 having a upward-tapered tip is interposed therebetween. A chamber 148 is provided above as facing the gate 149 via a cylinder 143 having a slidable operating rod 144 therein.

A diaphragm 145 of the valve 145b is fixed at the lower end of the operating rod 144 exposed downwards from the cylinder 143. Fixed at the upper end of the rod 144 exposed to the chamber 144 is a diaphragm 146 via which the chamber 148 is separated from an upper chamber 148a. The diaphragms 145 and 146 are made of a flexible material such as silicon rubber. These diaphragms are fixed in the valve casing 151 such that their peripheral edges 145a and 146a are fit into slots 143a and 143b, respectively, formed in the casing.

Provided in the upper chamber 148a is a driving rod 152 connected to the motor 153 through the valve casing 151, movable vertically in FIG. 8. Also provided in the upper chamber 148a is a spring 147 hooked with a valve 146b of the diaphragm 146. The spring 147 is usually compressed to create an elastic force downwards.

In operation, the motor 153 starts in response to an output signal of a central processing unit (CPU) 100 to move up and down the operating rod 152 and also the operating rod 144 connected to the former rod. This rod vertical motion makes the valve 145b touch the gate 149 to adjust the flow rate of developing solution.

The ultrasonic flowmeter 120 propagates ultrasonic waves in both ways along a developing solution flowing therethrough. It also measures an ultrasonic-wave propagating time $t_A$ from left to right and another ultrasonic-wave propagating time $t_B$ from right to left in FIG. 7, thus sending an output signal to the CPU 100. On receiving the output signal, the CPU 100 calculates a flow rate of the developing solution based on the output signal and prestored parameters such as dynamic viscosity and hydroacoustic velocity corresponding to several types of developing solution.

The DEV unit will further be disclosed in detail for its operation.

A wafer W transferred by the main wafer-transfer mechanism 21 (FIG. 2) is held on the spin chuck 101 by suction force in the DEV unit, as shown in FIG. 5.

When the supply nozzle 110 has reached over the wafer edge from the waiting section 106, the valve V is opened to discharge (supplies) a developing solution onto the wafer W through the supply nozzle 110. While discharging area, travel speed, discharging (supply) amount, and pump pressure, etc. are varying, the supply nozzle 110 moves over the wafer W almost horizontally from the waiting section 106 to a predetermined position toward the other end of the rail 103, to form a film of developing solution having a thickness, for example, of 1 to 2 mm on the wafer W. The supply nozzle 110 then moves in one direction while the nozzle head is touching the film of developing solution on the wafer W, to spread the film over the entire wafer surface. This supply-nozzle movement is made so that the center of nozzle section 112 having the aligned discharging apertures 113, shown in FIG. 6, will cross over the wafer center.

The valve V is closed when the supply nozzle 110 has reached over the other wafer edge, to halt the supply of developing solution.

The DEV unit is connected to a developing-solution tank 180 installed in a lower chamber 29 (FIG. 3) of the processing station 20 via a main pipe 140 shown in FIG. 9. The developing solution is sent from the tank 180 to the DEV unit by a feed pump 160 (processing-solution pressure-up feeder) provided along the pipe 140.

The feed pump 160 that is a diaphragm pump, for example, feeds the developing solution from the developing-solution tank 180 to several supply nozzles 110 (FIG. 7) at a pressure regulated by a pressure regulator such as a regulator ER.

Figure 10:
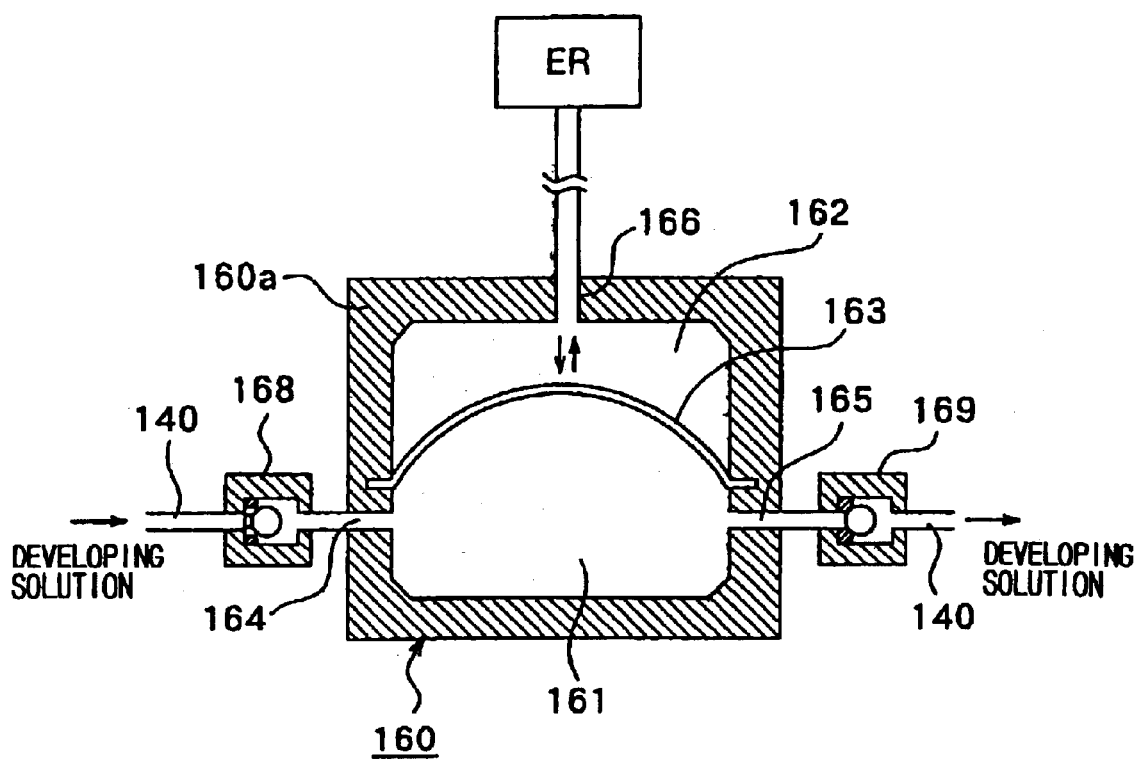
FIG. 10 is a schematic sectional view of a processing-solution pressurized feeding mechanism according to the present invention.

As shown in FIG. 10, the developing-solution tank 180 consists of a pump chamber 161 for containing the developing solution and an air chamber 162 for containing compressed air. The chambers 161 and 162 are separated from each other in a body 160a by a diaphragm 163 made of an elastic material such as silicon rubber. The diaphragm 163 is usually set in the body 160a as expanding towards the air chamber 162.

Figure 11:
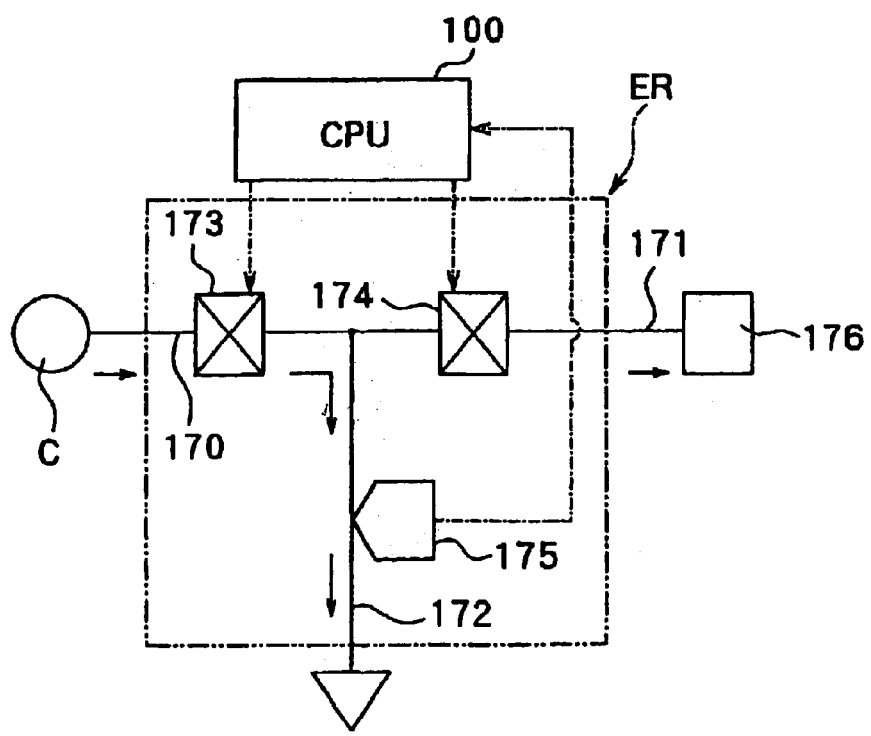
FIG. 11 is a schematic illustration of a pressure adjuster according to the present invention.

Provided on both sides of the body 160a are an inflow pipe 164 that connects the main pipe 140 and the pump chamber 161 at the developing-solution tank 180 side (left in FIG. 10) and an outflow pipe 165 that connects the main pipe 140 and the pump chamber 161 at the supply nozzle 110 side (right in FIG. 10). Proveded on the air chamber 162 at the upper section of the body 160a is an air-intake hole 166 through which compressed air will be taken into the chamber 162 from a compressor C (FIG. 11) via an electropneumatic regulator ER.

Provided along the inflow pipe 164 and the outflow pipe 165 are check valves 168 and 169, respectively, to allow the developing solution to flow only in the direction indicated by arrows in FIG. 10. Particularly, the check valve 168 provided at the inflow pipe side has a slow-leak mechanism to allow a very small amount of developing solution from the main pipe 140 to the inflow pipe 164 even when the valve 168 is closed, to provide almost constant pump pressure.

The feed pump 160 is driven with inflow/outflow of compressed air to/from the air chamber 162 through the air-intake hole 166.

In detail, the diaphragm 163 is pulled upwards in FIG. 10 when compressed air has been discharged from the chamber 162. The check valve 168 at the inflow pipe side is opened while the diaphragm 163 is expanding like a cup, as shown in FIG. 10, to allow the developing solution to be flown into the inflow pipe 164 from the main pipe 140 so that the pump chamber 161 will be filled with the developing solution.

The air pressure in the air chamber 162 will be raised while compressed air is being taken into the chamber 162 through the air-intake hole 166, to press the diaphragm 163 downwards so that the volume of the pump chamber 161 will become small. This action causes pressure to the developing solution filled in the chamber 161 to close the check valve 168 at the inflow side while open the check valve 169 at the outflow side to feed the developing solution to the main pipe 140 through the outflow pipe 165.

The feed pump 160 may be a bellows type other than the diaphragm type, to feed the developing solution to the main pipe 140 from the developing-solution tank at a specific pressure.

The electropneumatic regulator ER has an intake pipe 170 for air inflow, an exhaust pipe 171 and an output pipe 172 connected between the two pipes. Provided along the pipes 170 and 171 are electromagnetic valves 173 and 174, respectively, to open/close the pipes in response to signals from the CPU 100. The intake pipe 170 is connected to an air compressor C while the exhaust pipe 171 is connected to an exhaust pump 176. The output pipe 172 is connected to the compressed-air-driven feed pump 160. Provided along the output pipe 172 is a pressure sensor 175 for detecting air pressure in the pipe 172, a detection signal being sent to the CPU 100.

In operation, the electromagnetic valves 173 and 174 are controlled by the CPU 100 based on the air pressure in the output pipe 172 detected by the pressure sensor 175, to regulate the air pressure in the pipe 172 so that the developing solution can be supplied to two DEV units.

For example, 500-kPa compressed air is supplied to the intake pipe 170 from the air compressor C at 300 kPa for air pressure in the output pipe 172, through the opened electromagnetic valve 173 while the electromagnetic valve 174 is being closed.

Whenever the pressure sensor 175 detects that air pressure in the output pipe 172 has exceeded the set pressure 300 kPa, the CPU 100 immediately closes the electromagnetic valve 173 at the intake side to prevent the air pressure in the pipe 172 from exceeding the set pressure so much. Immediately with this, the CPU 100 opens the electromagnetic valve 174 at the exhaust side to lower the air pressure in the pipe 172 and then closes the valve 174 when the air pressure in the pipe 172 has been lowered to the set pressure 300 kPa.

On the contrary, when the air pressure in the out pipe 172 has been lower than the set pressure 300 kPa, the CPU 100 closes the electromagnetic valve 174 while opens the electromagnetic valve 173 to take in highly compressed air and then closes the valve 173 whenever the sensor-detected air pressure has reached the set pressure.

As disclosed, the driving power for the feed pump 160 can be regulated in accordance with the pressure of compressed air taken into the air chamber 162 and also the number of times of air inflow/outflow per unit of time by the electropneumatic regulator ER.

As shown in FIG. 9, a pressure sensor 150 is provided along the main pipe 140 at the outflow side of the feed pump 160, to detect the pressure of developing solution fed from the pump 160, a detection signal being sent to the CPU 100.

Also provided between the feed pump 160 and the pressure sensor 150 is a filter 155 for removing impurities and bubbles from the developing solution, for further accurate pressure detection.

The valve V, the ultrasonic flowmeter 120, the pressure sensor 150 and also the electropneumatic regulator ER are connected to the controller CPU 100.

Prestored in the CPU 100 are control data such as the order and time for wafers W to be transferred to the DEV unit, the amount of developing solution to be supplied onto each wafer W, parameters (dynamic viscosity, hydroacoustic velocity, etc.) corresponding to several types of developing solution, and length and lift from the feed pump 160 to the supply nozzle 160. Based on these control data and detection signals from the ultrasonic flowmeter 120 and pressure sensor 150, the CPU 100 controls the valve V and the electropneumatic regulator ER so that a predetermined amount of developing solution can be constantly supplied onto a wafer W transferred in the DEV unit.

Disclosed next are several embodiments in which the coating apparatus according to the present invention is applied to the DEV unit disclosed above.

First Embodiment

The first embodiment employs several DEV units each equipped with a developing-solution supply nozzle 110. The DEV units share one feed pump 160 for feeding a developing solution to the supply nozzles 110, thus achieving supply of developing solution to wafers W in which the amount of developing solution may be varied per supply nozzle 110.

Figure 12:
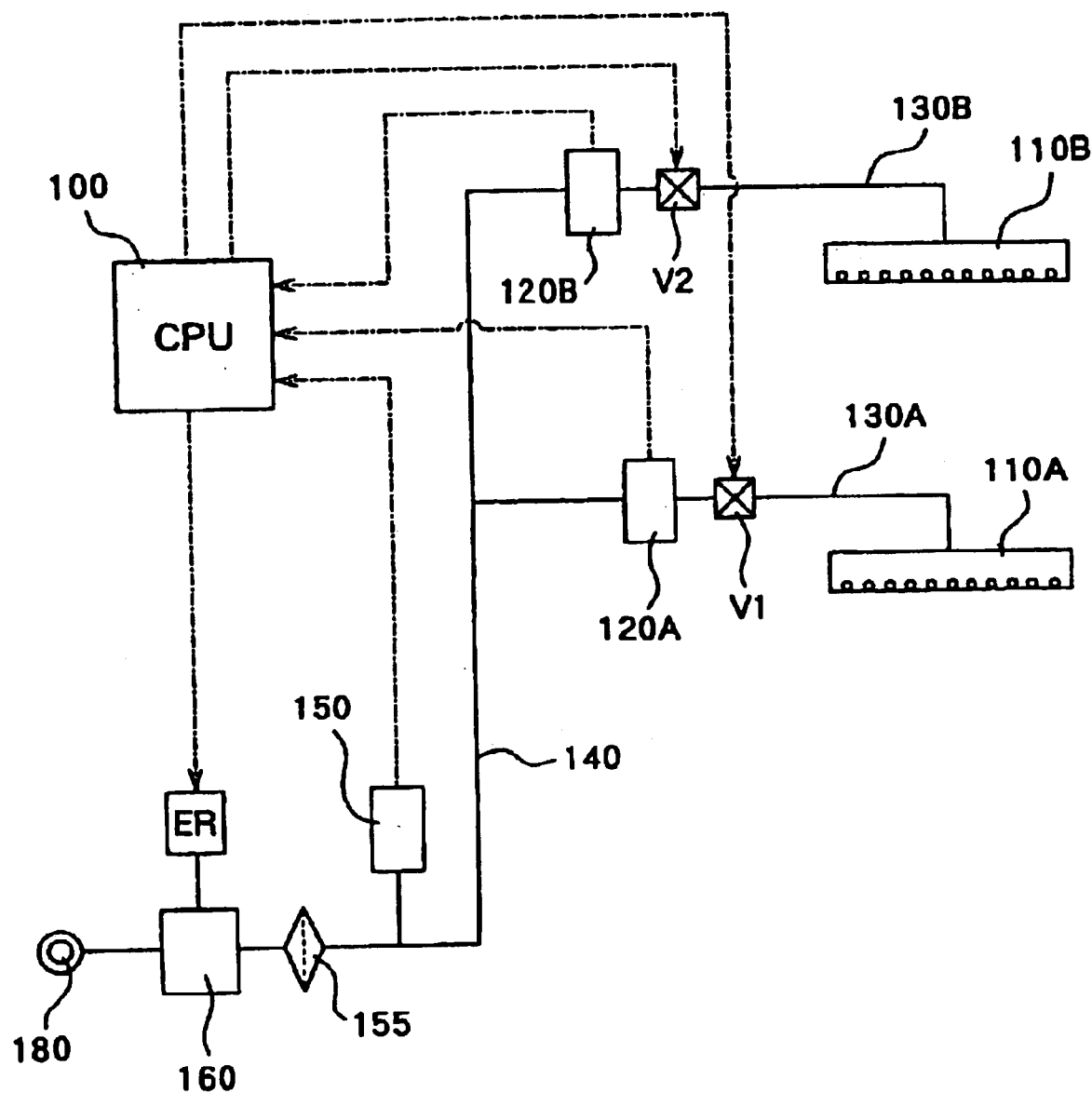
FIG. 12 is a schematic illustration of a coating apparatus in the first embodiment according to the present invention.

In detail, as shown in FIG. 12, the coating apparatus in this embodiment incorporates a first DEV unit (DEV1) having a first supply nozzle 110A, provided at the lower stage and a second DEV unit (DEV2) having a second supply nozzle 110B, provided at the upper stage.

Branch pipes 130A and 130B connected to the first and the second supply nozzles 110A and 110B, respectively, are both connected to a common main pipe 140, through which a developing solution is fed to each DEV unit from a developing-solution tank 180.

Ultrasonic flowmeters 120A and 120B, and valves V1 and V2 provided for the first and second units DEV1 and DEV2, respectively, an electro pneumatic regulator ER and a pressure sensor 150 are all connected to a CPU 100.

The valves V1 and V2, and also the electropneumatic regulator ER are controlled by the CPU 100 to supply a predetermined amount of developing solution to a wafer W transferred in each DEV unit. The CPU control is carried out based on detection signals from the ultrasonic flowmeters 120A and 120B, and the pressure sensor 150 and also CPU-prestored control data such as the order and time for wafers W to be transferred to the DEV units, the amount of developing solution to be supplied onto each wafer W, parameters (dynamic viscosity, hydroacoustic velocity, etc.) corresponding to several types of developing solution, pipe length from the feed pump 160 to each DEV unit, and difference in lift from the feed pump 160 to the first supply nozzle 110A provided at the lower stage and the second supply nozzle 110B provided at the upper stage.

Figure 13A:
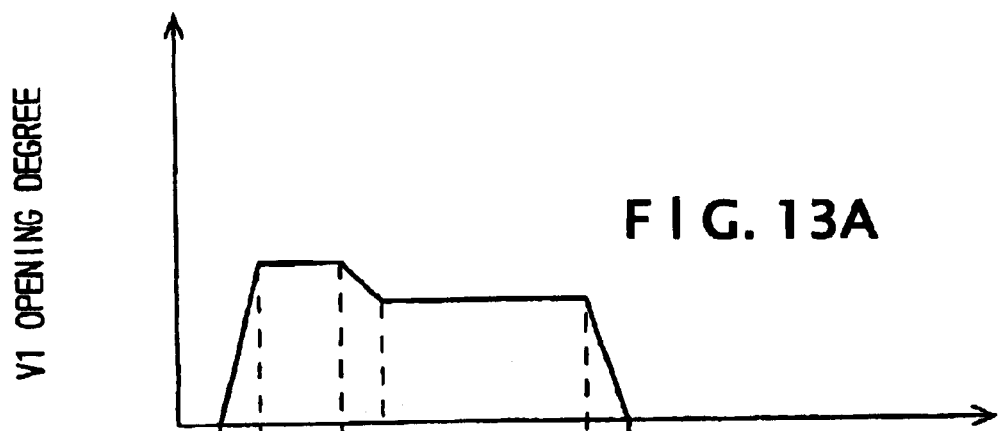
FIGS. 13A to 13C show timing charts for a coating process carried out by the coating apparatus in the first embodiment according to the present invention.
Figure 13B:
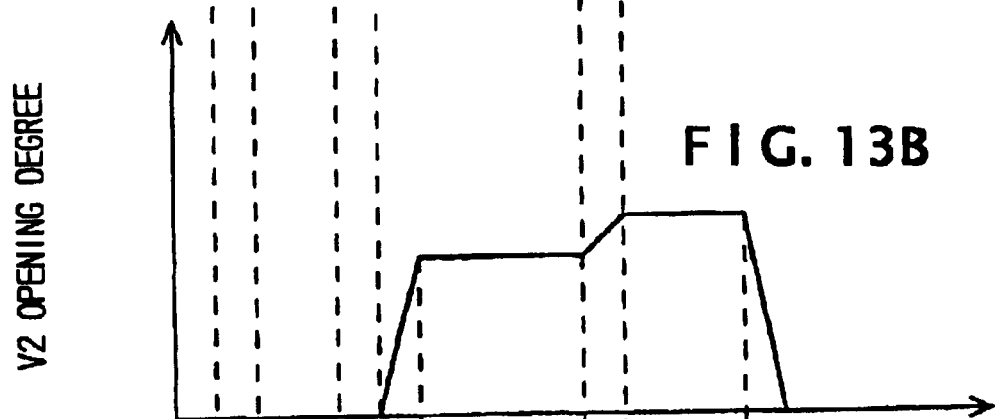
Figure 13C:
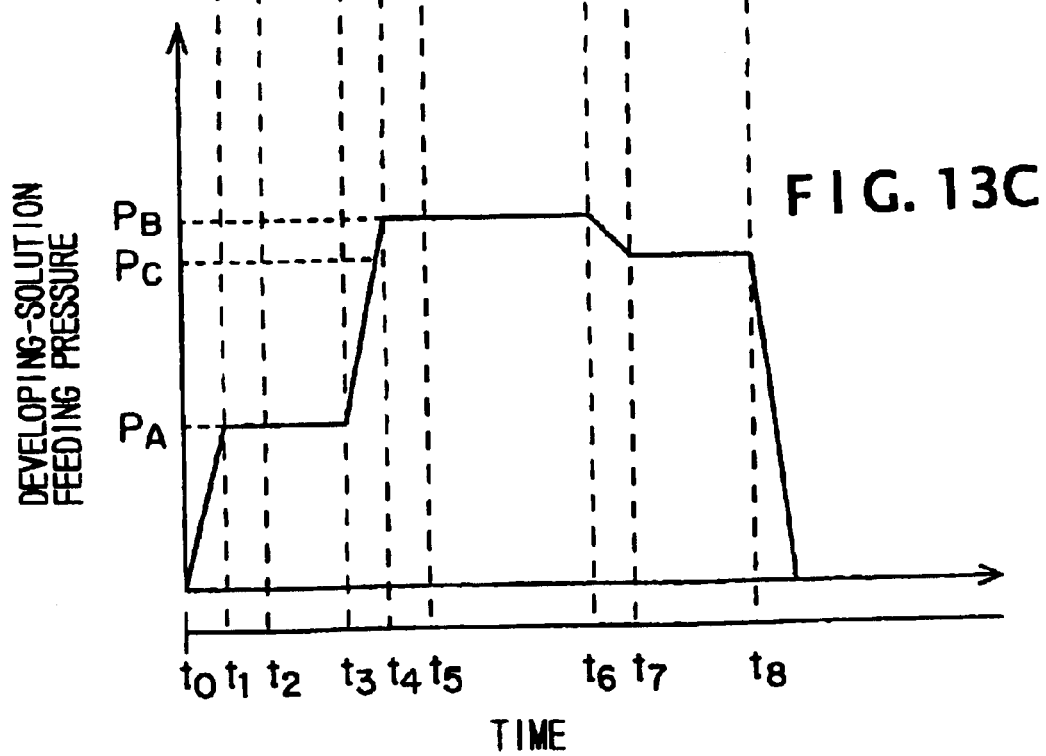

Disclosed below with reference to a flowchart shown in FIG. 13 is a wafer-coating method employing the coating apparatus described above in which the first and second units DEV1 and DEV2 operate at different timing such that a wafer W1 transferred into the first unit DEV1 is under a developing-solution coating process while another wafer W2 is transferred into the second unit DEV2 to start the developing-solution coating process.

The valves V1 and V2 for the first and second units DEV1 and DEV2, respectively, have been closed and the feed pump 160 has been turned off before the developing-solution coating process.

At a time $t_0$ before a time $t_1$ for the first unit DEV1 to start the developing-solution coating process to the wafer W1, the CPU 100 calculates the minimum pressure $P_A$ for feeding the developing solution to the first supply nozzle 110A based on the prestored control data such as parameters (dynamic viscosity, hydroacoustic velocity, etc.) corresponding to several types of developing solution, and pipe length and lift from the feed pump 160 to the nozzle 110A.

The minimum pressure $P_A$ and a pressure of the developing solution, fed through the main pipe 140, detected by the pressure detector 150 are compared with each other by the CPU 100 which then sends the comparison data to the electropneumatic regulator ER. Based on the comparison data, the regulator ER regulates the driving power for the feed pump 160 so that the pressure of the developing solution fed through the main pipe 140 can reach the minimum pressure $P_A$ before the time $t_1$ for the first unit DEV1 to start the developing-solution coating process to the wafer W1.

At the time $t_1$, the CPU 100 adjusts the opening degree of the valve V1 based on the prestored control data and the detection signals from the ultrasonic flowmeter 120A and the pressure sensor 150 so that a predetermined amount of the developing solution can be supplied onto the wafer W1.

In detail, the opening degree of the valve V1 is adjusted to a predetermined degree between the time $t_1$ and a time $t_2$, and regulated at a constant degree between the time $t_2$ and a time $t_3$. Moreover, the air pressure for feeding the developing solution from the feed pump 160 is regulated by the electropneumatic regulator ER at a constant level between the time $t_1$ and a time $t_3$.

Next, at the time $t_3$ before a time $t_4$ for the second unit DEV2 to start the developing-solution coating process to the wafer W2, the CPU 100 calculates the minimum pressure $P_B$ for feeding the developing solution to both of the first and the second supply nozzles 110A and 110B based on prestored control data such as parameters corresponding to the developing solution, and pipe length and lift from the feed pump 160 to the nozzles 110A and 11B.

The minimum pressure $P_B$ and a pressure of the developing solution, fed through the main pipe 140, detected by the pressure detector 150 are compared with each other by the CPU 100 which then sends the comparison data to the electro pneumatic regulator ER. Based on the comparison data, the regulator ER regulates the driving power for the feed pump 160 so that the pressure of the developing solution fed through the main pipe 140 can reach the minimum pressure $P_B$ before the time $t_4$ for the second unit DEV2 to start the developing-solution coating process to the wafer W2.

The opening degree of the valve V1 is adjusted by the CPU 100 based on the prestored control data and the detection signal from the ultrasonic flowmeter 120A so that the predetermined amount of the developing solution can be constantly supplied onto the wafer W1 while the air pressure for feeding the developing solution from the feed pump 160 varies from $P_A$ to $P_B$ between the time $t_3$ to $t_4$.

At the time $t_4$, the CPU 100 adjusts the opening degree of the valve V2 based on the prestored control data and the detection signals from the ultrasonic flowmeters 120A and 120B, and the pressure sensor 150 so that a predetermined amount of the developing solution can be supplied onto the wafer W2. The opening degree of the valve V2 is adjusted to a predetermined degree between the time $t_4$ and a time $t_5$, and regulated at a constant degree between the time $t_5$ and a time $t_6$.

On completion of the developing-solution coating process to the wafer W1 at the time $t_6$, the CPU 100 sends a signal to the valve V1 to close this valve.

Moreover, the CPU 100 calculates the minimum pressure $P_C$ for feeding the developing solution to the second supply nozzle 110B based on the prestored control data such as the parameters corresponding to the developing solution, and pipe length and lift from the feed pump 160 to the nozzle 110B.

The minimum pressure $P_C$ and a pressure of the developing solution, fed through the main pipe 140, detected by the pressure detector 150 are compared with each other by the CPU 100 which then sends the comparison data to the electropneumatic regulator ER. Based on the comparison data, the regulator ER regulates the driving power for the feed pump 160 so that the pressure of the developing solution fed through the main pipe 140 can reach the minimum pressure $P_C$.

The opening degree of the valve V2 is adjusted by the CPU 100 based on the prestored control data and the detection signal from the ultrasonic flowmeter 120B so that the predetermined amount of the developing solution can be constantly supplied onto the wafer W2 while the air pressure for feeding the developing solution from the feed pump 160 varies from PB to PC between the time t6 to a time t7.

On completion of the developing-solution coating process to the wafer W2 at a time $t_8$, the CPU 100 sends a signal to the valve V2 and the electropneumatic regulator ER, to close this valve V2 and stop the feed pump 160, thus finishing the developing-solution coating process.

As disclosed, in the first embodiment, the supply nozzles 110A and 110B can share one feed pump 160, thus the present invention achieving compactness in apparatus structure.

The developing-solution coating-process starting time $t_1$ and $t_4$ for the wafers W1 and W2, respectively, may be prestored in the CPU 100. Or, the CPU 100 can decide such process starting time based on detection of the transferred wafers W1 and W2.

The first embodiment employs two DEV units, however, not only that, the present invention is applicable to three or more DEV units which may be stacked each other or arranged in parallel on the same plane.

Figure 14:
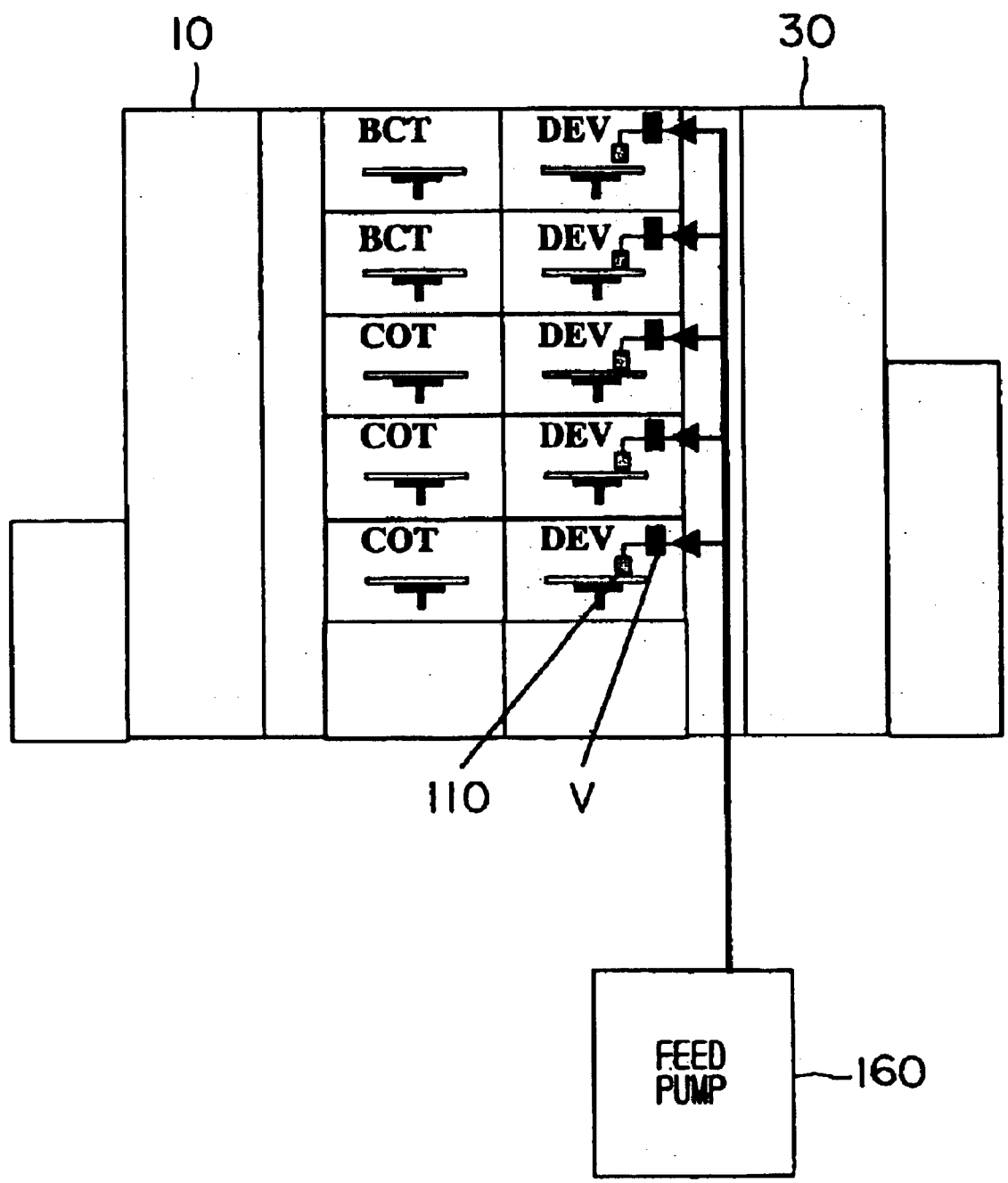
FIG. 14 is a schematic front view illustrating difference in lift from a feed pump to several processing units.

Discussed next with respect to FIG. 14 is the difference in lift from the feed pump 160 to the first supply nozzle 110A provided at the lower stage and the second supply nozzle 110B provided at the upper stage (FIG. 12), which is used as one of the control data for controlling the valves V1 and V2 and also the electropneumatic regulator ER, to supply a predetermined constant amount of developing solution onto a wafer W transferred to each DEV unit.

Shown in FIG. 14 is a processing system with five-stage processing units. In detail, two reflection-protective film coating units BCT are staked on three-stage COT units to constitute five-stage processing units, and five DEV units are stacked to constitute other five-stage processing units.

The processing system is disadvantageous in that the pressure of developing solution supplied to supply nozzles 110 (not shown) in the upper-stage DEV units from the feed pump 160 will become lower than that to supply nozzles 110 in the lower-stage DEV units.

This difference in pressure (lift) causes difference in flow rate of developing solution, thus results in difference in quality of developed wafers.

In order to overcome such disadvantage, the first embodiment employs the difference in lift as one of control data for controlling the valves V1 and V2 and also the electropneumatic regulator ER, to supply the same amount of developing solution to wafers transferred into each DEV unit.

Second Embodiment

The second embodiment employs one supply nozzle 200 having many discharging apertures divided into several blocks through each of which a predetermined amount of developing solution fed by a feed pump 160 is supplied onto a wafer W.

Figure 15:
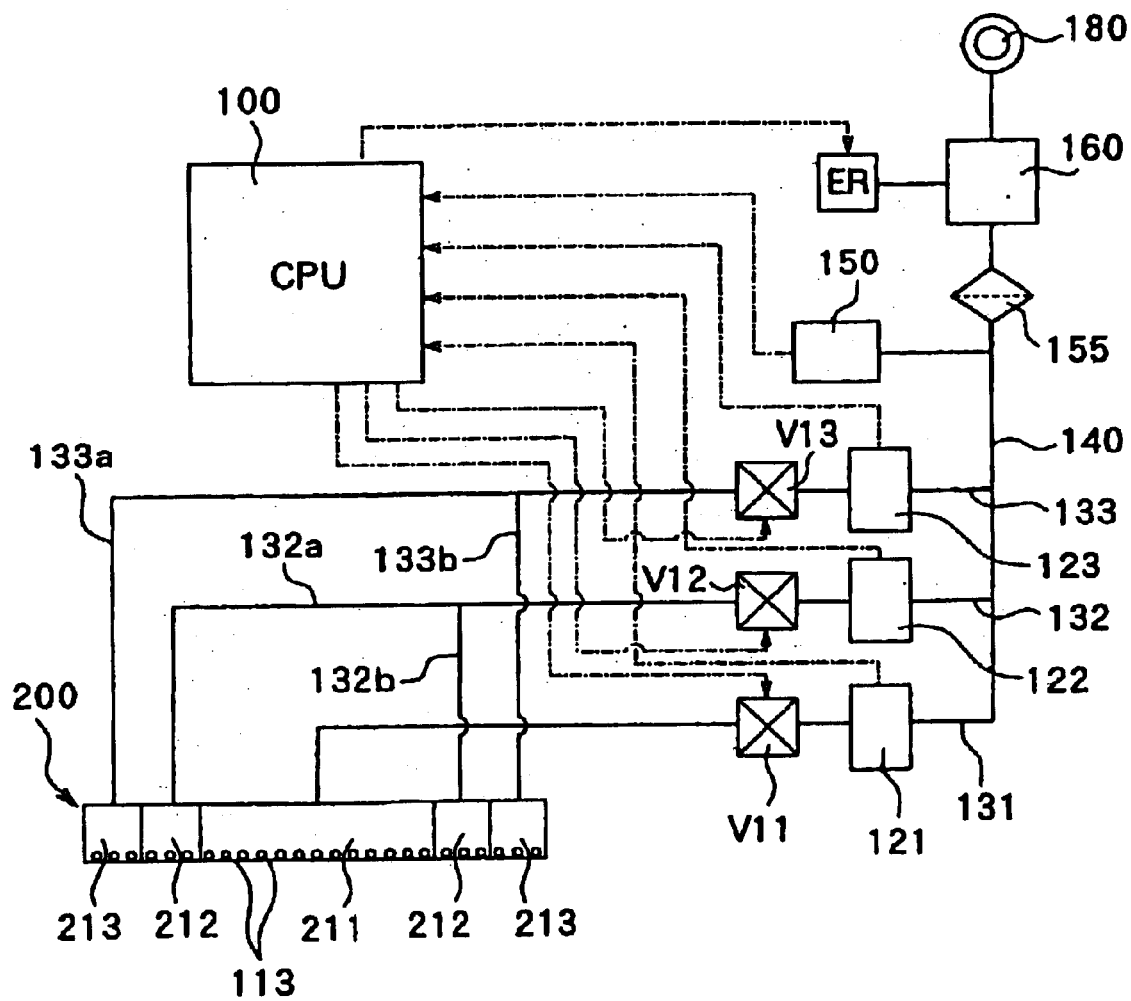
FIG. 15 is a schematic illustration of a coating apparatus in the second embodiment according to the present invention.

In detail, as shown in FIG. 15, many discharging apertures of the supply nozzle 200 are divided into a first block 211 located in the center in the transversal direction, two second blocks 212 located on both sides of the first block, and two third blocks 213 located outside the second blocks.

The first block 211 is connected to a branch pipe 131. The second blocks 212 are connected to branch pipes 132a and 132b that are connected to a common branch pipe 132. The third blocks 213 are connected to branch pipes 133a and 133b that are connected to a common branch pipe 133.

Provided along the branch pipes 131, 132 and 133 are valves V11, V12 and V13, respectively, for adjusting the flow rate of developing solution to a wafer W, and also ultrasonic flowmeters 121, 122 and 123, respectively, for detecting the flow rate of developing solution supplied from the supply nozzle 200 to the wafer W.

The branch pipes 131, 132 and 133 are connected to a developing-solution tank 180 through a common main pipe 140. Provided along the main pipe 140 are a feed pump 160 for feeding the developing solution from the tank 180 to the supply nozzle 200 and a pressure sensor 150 for detecting the pressure of the developing solution fed by the pump 160. Connected to the pump 160 is an electropneumatic regulator ER for regulating the pressure of the developing solution to be fed.

The valves V11, V12 and V13, the ultrasonic flowmeters 121, 122 and 123, the pressure sensor 150 and the electropneumatic regulator ER are all connected to a CPU 100. Based on prestored control data and detection signals from the ultrasonic flowmeters 121, 122 and 123, the pressure sensor 150, the CPU 100 controls the valves V11, V12 and V13 and also the electropneumatic regulator ER so that a predetermined amount of developing solution can be fed to each block of the supply nozzle 200 and supplied onto a wafer W.

Figure 16:
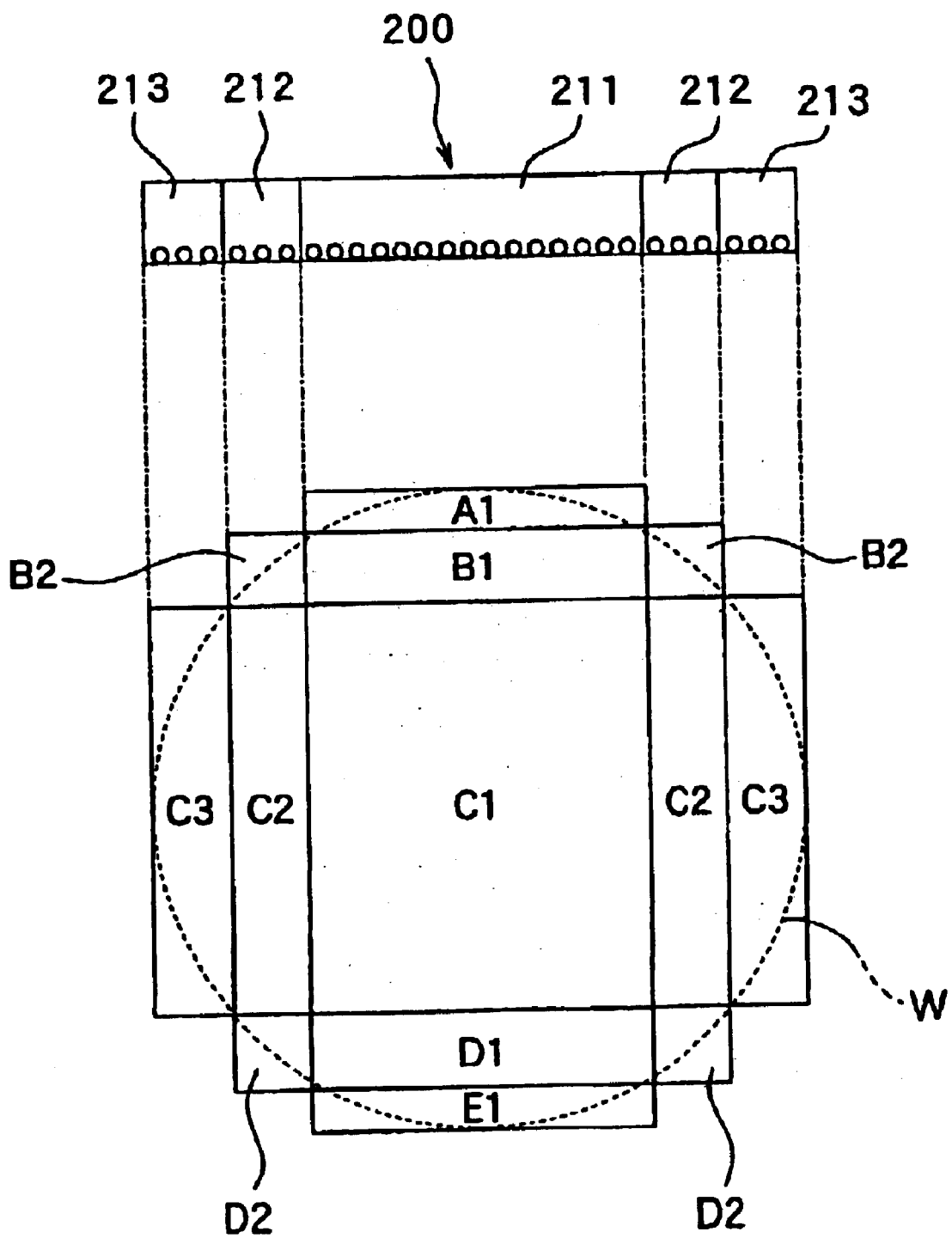
FIG. 16 is an illustration of coating fields on a target to be processed.

Disclosed next with reference to FIGS. 16 and 17 is a method of coating a wafer W with a developing solution from the supply nozzle 200 described above.

In order to save the amount of developing solution, as illustrated in FIG. 16, the area to be coated on the wafer W is divided into, for example, five fields A to E corresponding to the four blocks of the supply nozzle 200 so that the flow rate of developing solution can be varied for the five fields.

Among the five fields, the filed C is the wafer center field on which the diameter lies. The fields B and D are located on both sides of the filed C in a nozzle travel direction. The fields A and E are located outside the fields B and D, respectively, in the nozzle travel direction.

On a 12-inch wafer, for example, the filed C may be set at 80 mm in width on both sides of the wafer center, the fields B and D at 40 mm in width on both sides of the filed C, and the fields A and E set at 40 mm in width outside the fields B and D, respectively, in the nozzle travel direction.

The field C is divided into a subfield C1 onto which the developing solution will be supplied through the first block 211 of the supply nozzle 200, subfields C2 through the second blocks 212 and also subfields C3 through the third blocks 213.

The field B is divided into a subfield B1 onto which the developing solution will be supplied through the first block 211 of the supply nozzle 200 and subfields B2 through the second blocks 212.

The field D is divided into a subfield D1 onto which the developing solution will be supplied through the first block 211 of the supply nozzle 200 and subfields D2 through the second blocks 212.

The fields A (A1) and E (E1) will be supplied with the developing solution only through the first block 211 of the supply nozzle 200.

In operation, the valves V11, V12 and V13 (FIG. 15) have been closed and the feed pump 160 has been turned off while no wafer has been set in the DEV unit and the supply nozzle 200 has been waiting in the waiting section 106 (FIG. 5).

When a wafer W has been transferred into a DEV unit by the main wafer-transfer mechanism 21 (FIG. 2) and held on the spin chuck 101 by suction force, the supply nozzle 200 is moved over the wafer W from the waiting section 106 at a predetermined speed by the nozzle-scan arm 102.

When the supply nozzle 220 has reached over the field A on the wafer W, the CPU 100 calculates the minimum pressure $P_1$ for feeding the developing solution to the first block 211 of the nozzle 200 based on the prestored control data such as parameters (dynamic viscosity, hydroacoustic velocity, etc.) corresponding to the type of developing solution, and pipe length and lift from the feed pump 160 to the first block 211.

The minimum pressure $P_1$ and a pressure of the developing solution, fed through the main pipe 140, detected by the pressure detector 150 are compared with each other by the CPU 100 which then sends the comparison data to the electropneumatic regulator ER. Based on the comparison data, the regulator ER regulates the driving power for the feed pump 160 so that the pressure of the developing solution fed through the main pipe 140 can reach the minimum pressure $P_1$.

Figure 17A:
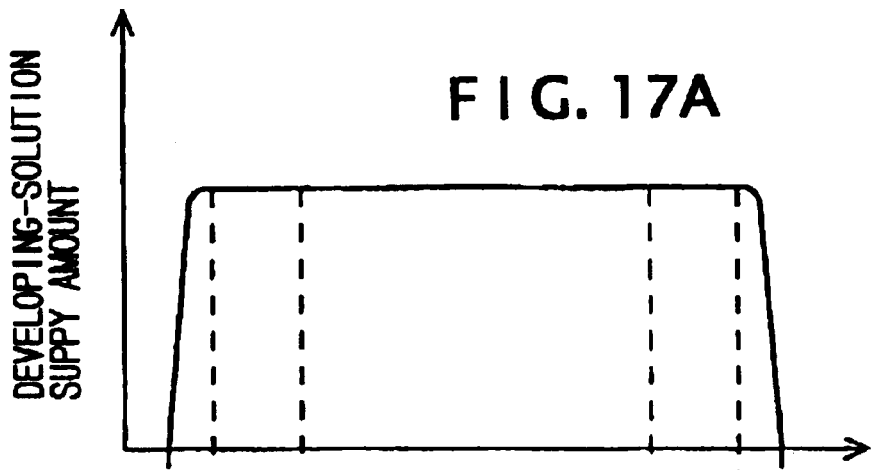
FIG. 17 is an illustration indicating the amount of processing solution to be supplied in the coating apparatus of the second embodiment according to the present invention.

The valve V11 is gradually opened, as shown in FIG. 17(a), at a specific speed by the CPU 100 so as not to give impact of the developing solution onto the wafer W based on the prestored control data and the detection signals from the ultrasonic flowmeter 121 and the pressure sensor 150, thus supplying a predetermined amount of developing solution onto the field A1 on the wafer W.

When the supply nozzle 220 has reached over the coating field B on the wafer W, the CPU 100 calculates the minimum pressure $P_2$ for feeding the developing solution to the first and second blocks 211 and 212 of the nozzle 200 based on the prestored control data such as parameters (dynamic viscosity, hydroacoustic velocity, etc.) corresponding to the type of developing solution, and pipe length and lift from the feed pump 160 to the first and second blocks 211 and 212.

The minimum pressure $P_2$ and a pressure of the developing solution, fed through the main pipe 140, detected by the pressure detector 150 are compared with each other by the CPU 100 which then sends the comparison data to the electropneumatic regulator ER. Based on the comparison data, the regulator ER regulates the driving power for the feed pump 160 so that the pressure of the developing solution fed through the main pipe 140 can reach the minimum pressure $P_2$.

Figure 17B:
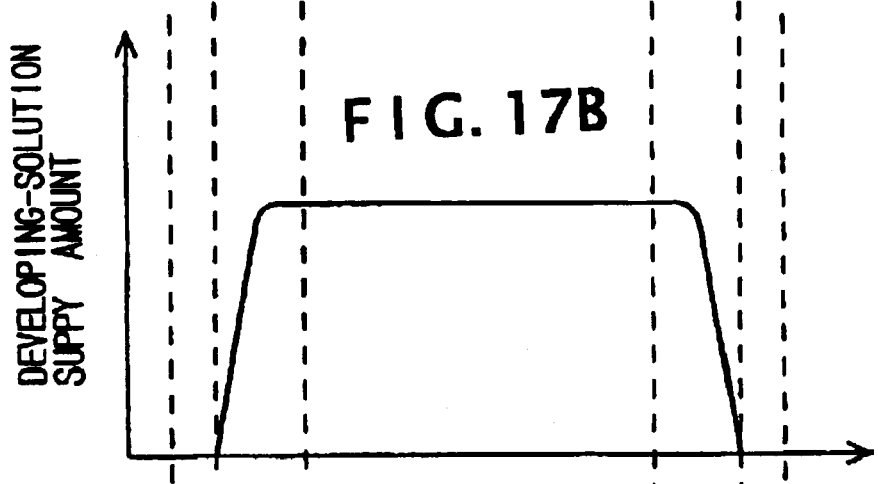

The valves V11 and V12 are gradually opened, as shown in FIG. 17(b), at a specific speed by the CPU 100 so as not to give impact of the developing solution onto the field B2 on the wafer W based on the prestored control data and the detection signals from the ultrasonic flowmeters 121 and 122 and also the pressure sensor 150, thus supplying a predetermined amount of developing solution onto the fields B1 and B2.

When the supply nozzle 220 has reached over the field C on the wafer W, the CPU 100 calculates the minimum pressure $P_3$ for feeding the developing solution to the first, second and third blocks 211, 212 and 213 of the nozzle 200 based on the prestored control data such as parameters (dynamic viscosity, hydroacoustic velocity, etc.) corresponding to the type of developing solution, and pipe length and lift from the feed pump 160 to the first, second and third blocks 211, 212 and 213.

The minimum pressure $P_3$ and a pressure of the developing solution, fed through the main pipe 140, detected by the pressure detector 150 are compared with each other by the CPU 100 which then sends the comparison data to the electropneumatic regulator ER. Based on the comparison data, the regulator ER regulates the driving power for the feed pump 160 so that the pressure of the developing solution fed through the main pipe 140 can reach the minimum pressure $P_3$.

Figure 17C:
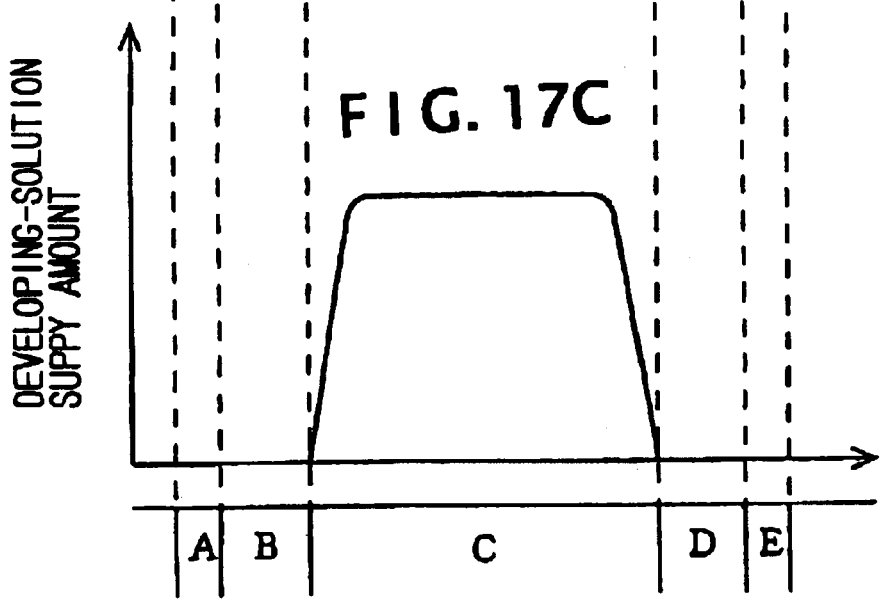

The valves V11, V12 and V13 are gradually opened, as shown in FIG. 17(c), at a specific speed by the CPU 100 so as not to give impact of the developing solution onto the field C3 on the wafer W based on the prestored control data and the detection signals from the ultrasonic flowmeters 121, 122 and 123 and also the pressure sensor 150, thus supplying a predetermined amount of developing solution onto the fields C1, C2 and C3.

When the supply nozzle 220 has approached over the field D on the wafer W at a specific speed, the valve V13 is gradually closed, as shown in FIG. 17(c), at a specific speed by the CPU 100 so as not to give impact of the developing solution onto the field C3 on the wafer W. The valve V13 is then completely closed when the supply nozzle 200 has reached over the field D.

The minimum pressure $P_2$ for feeding the developing solution to the first and second blocks 211 and 212 of the supply nozzle 200 is calculated by the CPU 100 based on the prestored control data.

The minimum pressure $P_2$ and a pressure of the developing solution, fed through the main pipe 140, detected by the pressure detector 150 are compared with each other by the CPU 100 which then sends the comparison data to the electropneumatic regulator ER. Based on the comparison data, the regulator ER regulates the driving power for the feed pump 160 so that the pressure of the developing solution fed through the main pipe 140 can reach the minimum pressure $P_2$.

The opening degree of each of the valves V1 and V2 is adjusted by the CPU 100 based on the prestored control data and the detection signals from the ultrasonic flowmeters 121 and 122 so that the predetermined amount of the developing solution can be constantly supplied onto the wafer W while the air pressure for feeding the developing solution from the feed pump 160 varies from $P_3$ to $P_2$.

When the supply nozzle 220 has approached over the field E on the wafer W at a specific speed, the valve V12 is gradually closed, as shown in FIG. 17(b), at a specific speed by the CPU 100 so as not to give impact of the developing solution onto the field D2 on the wafer W. The valve V12 is then completely closed when the supply nozzle 200 has reached over the field E.

The minimum pressure $P_1$ for feeding the developing solution to the first block 211 of the supply nozzle 200 is calculated by the CPU 100 based on the prestored control data.

The minimum pressure $P_1$ and a pressure of the developing solution, fed through the main pipe 140, detected by the pressure detector 150 are compared with each other by the CPU 100 which then sends the comparison data to the electropneumatic regulator ER. Based on the comparison data, the regulator ER regulates the driving power for the feed pump 160 so that the pressure of the developing solution fed through the main pipe 140 can reach the minimum pressure $P_1$.

The opening degree of the valves V11 is adjusted by the CPU 100 based on the prestored control data and the detection signal from the ultrasonic flowmeter 121 so that the predetermined amount of the developing solution can be constantly supplied onto the wafer W while the air pressure for feeding the developing solution from the feed pump 160 varies from $P_2$ to $P_1$.

On almost completion of coating process to the filed E while the supply nozzle 200 has moved over the wafer W at a specific speed, as shown in FIG. 17(a), the valve V11 is gradually closed at a specific speed by the CPU 100 so as not to give impact of the developing solution onto the field E1 on the wafer W. The valve V11 is then completely closed when the supply nozzle 200 has reached over the wafer edge furthest from the waiting section 106.

As disclosed above, the second embodiment offers developing-solution amount adjustments for each field on the wafer W, thus saving the developing solution. Furthermore, the second embodiment offers control of the electropneumatic regulator ER while the wafer developing process is proceeding, thus achieving accurate adjustments to the amount of developing solution.

The second embodiment employs the supply nozzle 200 divided into three blocks, however, not only that, the present invention is applicable to division into two or four or more.

Furthermore, the supply-nozzle scan arm 102 may be connected to the CPU 100 in control of the travel speed and amount of developing solution for the supply nozzle 200, for further developing-solution saving and uniform coating process.

Third Embodiment

The third embodiment employs the supply nozzle 200 in the second embodiment as incorporated into the coating apparatus in the first embodiment, in which a developing solution is fed to each of two supply nozzles 200 from a common feed pump 160, for supplying a predetermined amount of developing solution to each coating field on a wafer.

Figure 18:
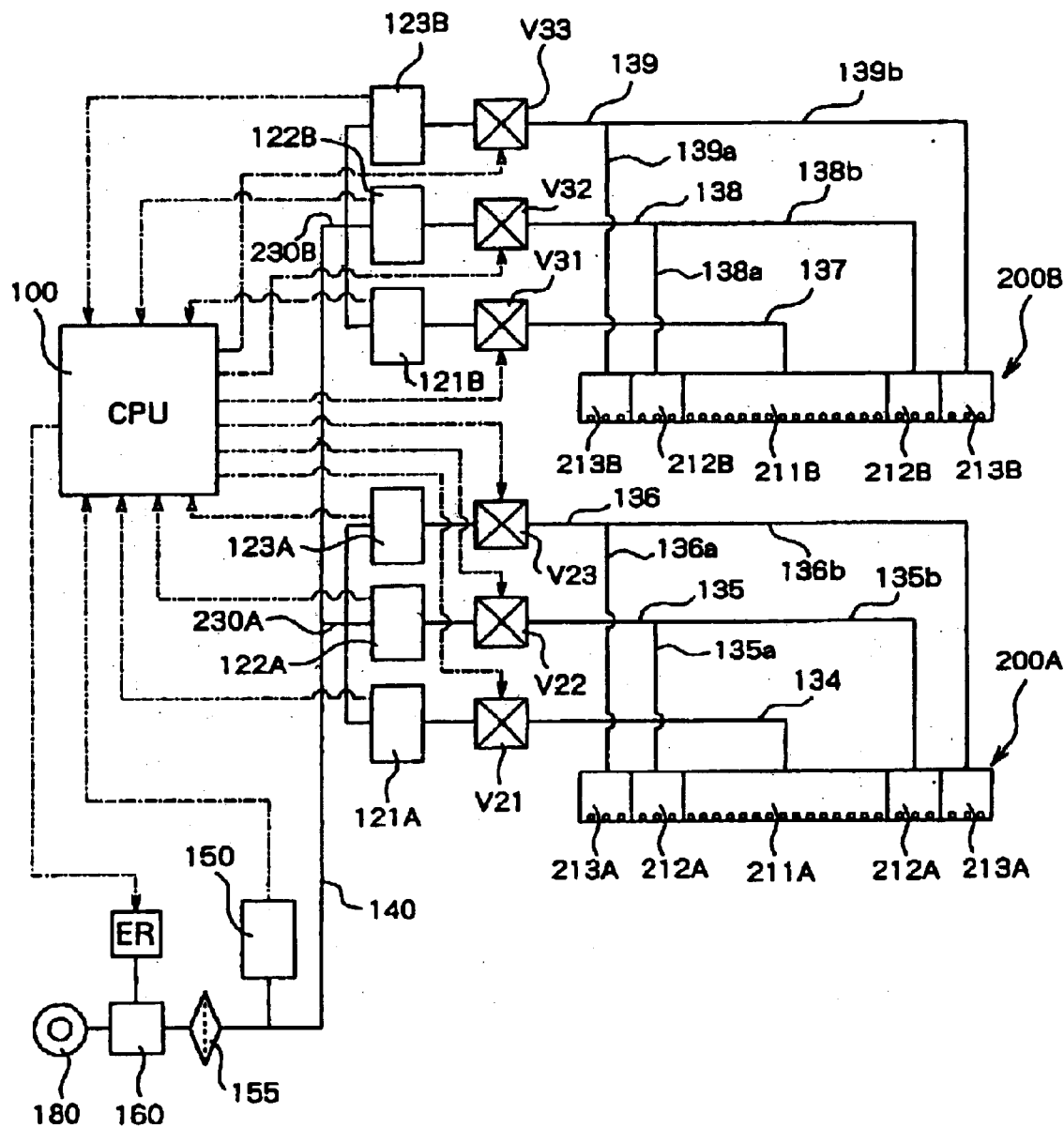
FIG. 18 is a schematic illustration of a coating apparatus in the third embodiment according to the present invention.

In detail, as shown in FIG. 18, a first block 211A of a first supply nozzle 200A is connected to a first branch pipe 134, second blocks 212A of the nozzle 200A to branch pipes 135a and 135b connected to a common branch pipe 135, and third blocks 213A of the nozzle 200A to branch pipes 136a and 136b connected to a common branch pipe 136.

Likewise, a first block 211B of a second supply nozzle 200B is connected to a first branch pipe 137, second blocks 212B of the nozzle 200B to branch pipes 138a and 138b connected to a common branch pipe 138, and third blocks 213B of the nozzle 200A to branch pipes 139a and 139b connected to a common branch pipe 139.

The branch pipes 134, 135 and 136 are connected to a branch pipe 230A. The branch pipes 137, 138 and 139 are connected to a branch pipe 230B. The branch pipes 230A and 230B are connected to a main pipe 140.

Based on detection signals from ultrasonic flowmeters 121A, 122A, 123A, 121B, 122B and 123B and a pressure sensor 150, and also control data prestored in a CPU 100, the feed pump 160 is controlled via an electropneumatic regulator ER and the opening degrees of valves V21, V22, V23, V31, V32 and V33 are controlled so that appropriate amounts of developing solution can be supplied to blocks 211A, 212A and 213A of the first supply nozzle 200A and also blocks 211B, 212B and 213B of the second supply nozzle 200B. In detail, the same amount of developing solution will be supplied to the block 211A of the first supply nozzle 200A and the block 211B of the second supply nozzle 200B, the same being true for the other blocks.

As disclosed above, the third embodiment requires only one feed pump 160, thus achieving compactness in apparatus structure.

In FIG. 18, the components, other than those described above, referenced by the same reference numbers as the counterparts in the first and second embodiments will not be explained for brevity.

The branch pipes 134 to 139 may be directly connected to the main pipe 140, other than that the branch pipes 134, 135 and 136, and 137, 138 and 139 are connected to the branch pipe 230A and 230B, respectively.

Disclosed in the first to the third embodiments is that the pressure of developing solution fed by the feed pump 160 is controlled during the coating process and also the opening degree of the valve (or valves) is controlled for supply of a predetermined amount of developing solution.

Not only that, the maximum pressure of developing solution may be calculated based on control data prestored in the CPU 100 for adjusting the pressure of developing solution to the maximum pressure before the coating process, thus the valve (or valves) being only controlled during the coating process.

Figure 19:
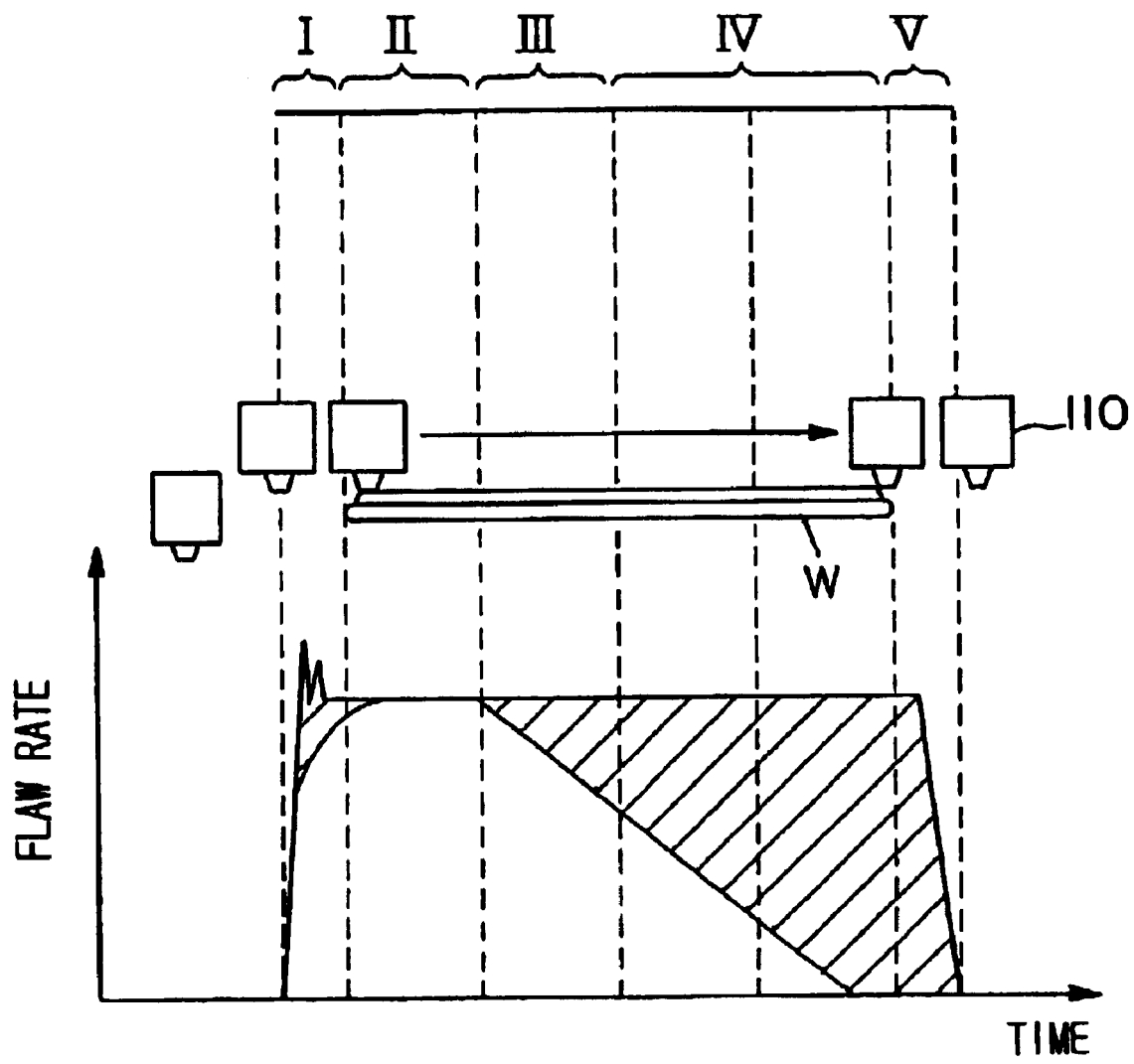
FIG. 19 is an illustration explaining a method of varying the flow rate of processing solution according to the present invention.

Disclosed in the second and third embodiments are the methods of switching the coating-solution discharging areas, not only that, however, the present invention is applicable to varying the flow rate of processing solution in accordance with the movement of supply nozzle over a wafer, as illustrated in FIG. 19.

In detail, as shown in FIG. 19, the flow rate of processing solution, such as, a developing solution from the supply nozzle 110 is controlled by the CPU 100 as disclosed below while the supply nozzle 110 is moving over a wafer W.

The flow rate is first increased to a set constant rate while the supply nozzle 110 is moving from a region I to a region II in the vicinity of a wafer edge. The constant flow rate is maintained from the region II to a region III in the vicinity of the wafer center which requires most the processing solution. The flow rate is then gradually decreased from the region III to a region IV, to spread the processing solution over the entire wafer surface with the supply-nozzle tip. The flow rate is further gradually decreased from the region IV to a region V in the vicinity of the other wafer edge, thus finishing the processing-solution supplying process.

This flow-rate control is advantageous in the amount of processing solution being about one-half of that (constant amount) in known methods, the processing solution being uniformly supplied over the wafer W, almost the same yielding as in known methods (constant processing-solution supply) and also high repeatability in flow-rate control with the CPU 100.

The DEV unit is described in the embodiments as a coating apparatus, not only that, however, the present invention is applicable to any other types of coating apparatus for supplying processing solution onto a target to be processed, such as, a COT unit for coating the wafer surface with a resist solution.

As disclosed above in detail, the present invention has several advantages as listed below.

(1) A coating method in this invention includes the steps of: supplying a processing solution onto surfaces of targets to be processed from a plurality of processing-solution suppliers; adjusting, via a flow-rate adjuster, a flow rate of the processing solution while supplied to each target from the corresponding processing-solution supplier; feeding the processing solution from a processing-solution supply source at a specific pressure via a processing-solution pressure-up feeder; adjusting, via a pressure adjuster, the pressure of the processing solution fed via the processing-solution pressure-up feeder to another specific pressure or more at which the processing solution is fed to the processing-solution suppliers at least when the processing-solution suppliers are operating simultaneously; detecting, via a flow-rate detector, a flow rate of the processing solution supplied via the processing-solution pressure-up feeder; detecting, via a pressure detector, the pressure of the processing solution fed via the processing-solution pressure-up feeder; and controlling the flow-rate adjuster and the pressure adjuster based on prestored control data and detection signals from the flow-rate detector and the pressure detector so that same amount of the processing solution is supplied to the targets to be processed from the processing-solution suppliers.

(2) Another coating method in this invention includes the steps of: supplying a processing solution onto a surface of at least one target to be processed from at least one processing-solution supplier, the surface of the target being divided into a plurality of fields; adjusting, via a flow-rate adjuster, a flow rate of the processing solution while supplied to each field on the target while the processing-solution supplier is moving in relative motion to the target; feeding the processing solution from a processing-solution supply source at a specific pressure via a processing-solution pressure-up feeder; adjusting, via a pressure adjuster, the pressure of the processing solution fed via the processing-solution pressure-up feeder to another specific pressure or more at which the processing solution is supplied to all of the fields on the target at least simultaneously; detecting, via a flow-rate detector, a flow rate of the processing solution supplied to each field on the wafer; detecting, via a pressure detector, the pressure of the processing solution fed via the processing-solution pressure-up feeder; and controlling the flow-rate adjuster and the pressure adjuster based on prestored control data and detection signals from the flow-rate detector and the pressure detector so that the processing solution is supplied to each field on the target at a predetermined flow rate from the processing-solution suppliers.

(3) A coating apparatus in this invention includes: a plurality of processing-solution suppliers to supply a processing solution onto surfaces of a plurality of targets to be processed; a flow-rate adjuster, provided for each processing-solution supplier, to adjust a flow rate of the processing solution while supplied to the targets; a processing-solution pressure-up feeder to feed the processing solution from a processing-solution supply source at a specific pressure to each processing-solution supplier; a pressure adjuster to adjust the pressure of the processing solution fed via the processing-solution pressure-up feeder to another specific pressure or more at which the processing solution is fed to the processing-solution suppliers at least when the processing-solution suppliers are operating simultaneously; a flow-rate detector to detect a flow rate of the processing solution supplied from each processing-solution supplier; a pressure detector to detect the pressure of the processing solution fed via the processing-solution pressure-up feeder; and a controller to control the flow-rate adjuster and the pressure adjuster based on prestored control data and detection signals from the flow-rate detector and the pressure detector so that the same amount of processing solution is supplied to the targets from the processing-solution suppliers.

(4) Another coating apparatus in this invention includes: at least one processing-solution supplier having a plurality of processing-solution supplying apertures divided into a plurality of blocks through which a processing solution is supplied onto a surface of at least one target to be processed; a transfer mechanism to move the processing-solution supplier in relative motion to the target; a flow-rate adjuster, provided for each block of the processing-solution supplier, to adjust a flow rate of the processing solution while supplied to the target; a processing-solution pressure-up feeder to feed the processing solution from a processing-solution supply source at a specific pressure to the processing-solution supplier; a pressure adjuster to adjust the pressure of the processing solution fed via the processing-solution pressure-up feeder to another specific pressure or more at which the processing solution is fed at least to one or more of the blocks through which the processing solution is supplied simultaneously; a flow-rate detector to detect a flow rate of the processing solution supplied through each block of the processing-solution supplier; a pressure detector to detect the pressure of the processing solution fed via the processing-solution pressure-up feeder; and a controller to control the flow-rate adjuster and the pressure adjuster based on prestored control data and detection signals from the flow-rate detector and the pressure detector so that a predetermined flow rate of processing solution is supplied to the target through each block of the processing-solution supplier.

According to the coating method (1) and the coating apparatus (2), the flow-rate adjuster and the pressure adjuster are controlled based on prestored control data and detection signals from the flow-rate detector and the pressure detector in accordance with how the processing-solution suppliers are installed, for feeding the processing solution from the processing-solution supply source to the several processing-solution suppliers via the common processing-solution pressure-up feeder. Thus, the present invention requires only one processing-solution pressure-up feeder for several processing-solution suppliers, and hence achieving compactness in coating apparatus.

The pressure adjuster may be controlled before the targets are processed or while the targets are being processed. Especially, the pressure-adjuster control simultaneously with target processing offers real-time coating process, thus achieving accurate adjustments.

Moreover, a processing-solution supplying method in this invention includes the steps of: increasing a flow rate of a processing solution up to a set constant rate toward a region in the vicinity of an edge of a rotating target to be processed; supplying the processing solution at the set constant rate from the region in the vicinity of the edge to another region in the vicinity of the center of the target; decreasing the flow rate of the processing solution on a specific region between the region in the vicinity of the center of the target to a region in the vicinity of another edge of the target, thus spreading the processing solution over the surface of the target; and decreasing further gradually the flow rate of the processing solution from the specific region to the region in the vicinity of the other edge of the target.

The processing-solution supplying method in this invention is economical because it requires the processing solution almost one-half of that (constant amount) in known methods, for constant amount of processing solution onto a wafer. Still, this method achieves almost the same yielding as in known methods (constant processing-solution supply). Moreover, this method achieves high repeatability in flow-rate control with CPU.

What is claimed is:

1. A coating apparatus comprising:
    a plurality of processing-solution suppliers to supply a processing solution onto surfaces of a plurality of targets to be processed;
    a flow-rate adjuster, provided for each processing-solution supplier, to adjust a flow rate of the processing solution while supplied to the targets;
    a processing-solution pressure-up feeder to feed the processing solution from a processing-solution supply source at a specific pressure to each processing-solution supplier;
    a pressure adjuster to adjust the pressure of the processing solution fed via the processing-solution pressure-up feeder to another specific pressure or more at which the processing solution is fed to the processing-solution suppliers at least when the processing-solution suppliers are operating simultaneously;
    a flow-rate detector to detect a flow rate of the processing solution supplied from each processing-solution supplier;
    a pressure detector to detect the pressure of the processing solution fed via the processing-solution pressure-up feeder; and
    a controller to control the flow-rate adjuster and the pressure adjuster based on prestored control data and detection signals from the flow-rate detector and the pressure detector so that the same amount of processing solution is supplied to the targets from the processing-solution suppliers.

2. The coating apparatus according to claim 1 further comprising:
    a plurality of processing units stacked each other in which the processing-solution suppliers are installed; and
    a plurality of processing-solution supply pipes to connect the processing-solution suppliers and the processing-solution supply source, the processing solution being fed by the processing-solution pressure-up feeder to the processing-solution suppliers through the processing-solution supply pipes.

3. A coating apparatus comprising:
    at least one processing-solution supplier having a plurality of processing-solution supplying apertures divided into a plurality of blocks through which a processing solution is supplied onto a surface of at least one target to be processed;
    a transfer mechanism to move the processing-solution supplier in relative motion to the target;
    a flow-rate adjuster, provided for each block of the processing-solution supplier, to adjust a flow rate of the processing solution while supplied to the target;
    a processing-solution pressure-up feeder to feed the processing solution from a processing-solution supply source at a specific pressure to the processing-solution supplier;
    a pressure adjuster to adjust the pressure of the processing solution fed via the processing-solution pressure-up feeder to another specific pressure or more at which the processing solution is fed at least to one or more of the blocks through which the processing solution is supplied simultaneously;
    a flow-rate detector to detect a flow rate of the processing solution supplied through each block of the processing-solution supplier;
    a pressure detector to detect the pressure of the processing solution fed via the processing-solution pressure-up feeder; and
    a controller to control the flow-rate adjuster and the pressure adjuster based on prestored control data and detection signals from the flow-rate detector and the pressure detector so that a predetermined flow rate of processing solution is supplied to the target through each block of the processing-solution supplier.

4. The coating apparatus according to claim 3 further comprising a plurality of processing-solution suppliers each having a plurality of processing-solution supplying apertures divided into a plurality of blocks through which the processing solution is supplied onto surfaces of a plurality of targets to be processed, wherein
    the controller controls the flow-rate adjuster and the pressure adjuster so that the same amount of processing solution is supplied through identical blocks of the processing-solution suppliers.

5. The coating apparatus according to claim 3 further comprising:
    a plurality of processing units stacked each other in which the processing-solution suppliers are installed; and
    a plurality of processing-solution supply pipes to connect the processing-solution suppliers and the processing-solution supply source, the processing solution being fed by the processing-solution pressure-up feeder to the processing-solution suppliers through the processing-solution supply pipes.

* * * * *